US011620923B2

(12) United States Patent
Heo et al.

(10) Patent No.: US 11,620,923 B2
(45) Date of Patent: Apr. 4, 2023

(54) DISPLAY DEVICE

(71) Applicant: Samsung Display Co., Ltd., Yongin-si (KR)

(72) Inventors: Kang Wook Heo, Cheonan-si (KR); Beohm Rock Choi, Seoul (KR); Hae Young Yun, Hwaseong-si (KR); Jung-Hyun Cho, Seoul (KR); Won Hak Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 245 days.

(21) Appl. No.: 17/014,372

(22) Filed: Sep. 8, 2020

(65) Prior Publication Data
US 2021/0264823 A1   Aug. 26, 2021

(30) Foreign Application Priority Data
Feb. 25, 2020  (KR) .................. 10-2020-0022890

(51) Int. Cl.
*G06F 3/041* (2006.01)
*H01L 27/12* (2006.01)
*G09G 3/3208* (2016.01)
*G06F 3/044* (2006.01)
*H01L 51/52* (2006.01)
*H01L 27/32* (2006.01)
*G09F 9/302* (2006.01)

(52) U.S. Cl.
CPC .............. *G09F 9/302* (2013.01); *G06F 3/044* (2013.01); *G06F 3/0412* (2013.01); *G09G 3/3208* (2013.01); *H01L 27/1214* (2013.01); *H01L 27/323* (2013.01); *H01L 51/5271* (2013.01)

(58) Field of Classification Search
CPC ..... G09G 3/3208; G06F 3/0412; G06F 3/044; H01L 51/5271; H01L 27/1214; H01L 27/323; G09F 9/302
USPC ............................... 361/679.02; 345/76, 174
See application file for complete search history.

(56) References Cited

U.S. PATENT DOCUMENTS

| 6,072,450 | A  | 6/2000  | Yamada et al. |
| 7,535,646 | B2 | 5/2009  | Chari et al. |
| 9,142,802 | B2 | 9/2015  | Miyamoto et al. |
| 2015/0333108 | A1 | 11/2015 | Miyamoto et al. |

(Continued)

FOREIGN PATENT DOCUMENTS

| EP | 3223122 A2 | 9/2017 |
| KR | 10-2014-0111505 A | 9/2014 |

(Continued)

*Primary Examiner* — Jimmy H Nguyen
(74) *Attorney, Agent, or Firm* — Lewis Roca Rothgerber Christie LLP

(57) ABSTRACT

A display device including a substrate; a first electrode on the substrate; a partitioning wall on the first electrode that includes a first opening that overlaps the first electrode; a touch detection electrode on the partitioning wall; a low refractive layer on the partitioning wall and the touch detection electrode, the low refractive layer including a second opening that overlaps the first opening; and a high refractive layer on the low refractive layer. Planar shapes of the first opening and the second opening are polygons, each including a series of sides, and a distance between one side of the first opening and the second opening is different than another side of the first opening and the second opening in a plan view.

20 Claims, 22 Drawing Sheets

(56) References Cited

U.S. PATENT DOCUMENTS

| | | | |
|---|---|---|---|
| 2017/0278899 A1 | 9/2017 | Yang et al. | |
| 2019/0165061 A1* | 5/2019 | Jung | H01L 27/3246 |
| 2019/0214435 A1 | 7/2019 | Yang et al. | |
| 2019/0221779 A1* | 7/2019 | Jang | H01L 27/323 |
| 2019/0341428 A1* | 11/2019 | Lee | H01L 51/5256 |
| 2020/0350516 A1 | 11/2020 | An et al. | |
| 2021/0005845 A1 | 1/2021 | Kim et al. | |

FOREIGN PATENT DOCUMENTS

| | | |
|---|---|---|
| KR | 10-2015-0113847 A | 10/2015 |
| KR | 10-2019-0004863 A | 1/2019 |
| KR | 10-2019-0062968 A | 6/2019 |
| KR | 10-2019-0088148 A | 7/2019 |
| KR | 10-2020-0127103 A | 11/2020 |
| KR | 10-2021-0004006 A | 1/2021 |

* cited by examiner

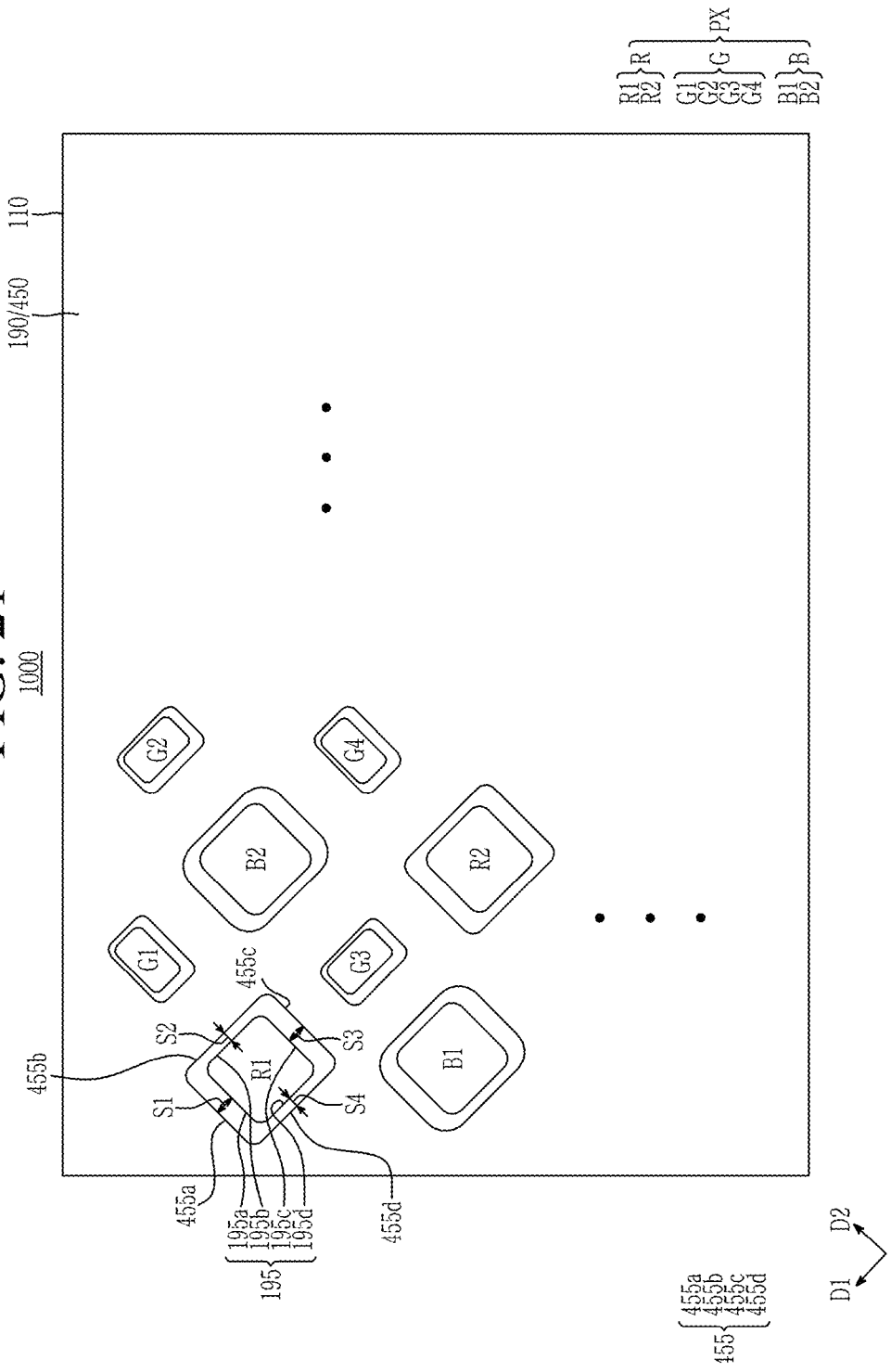

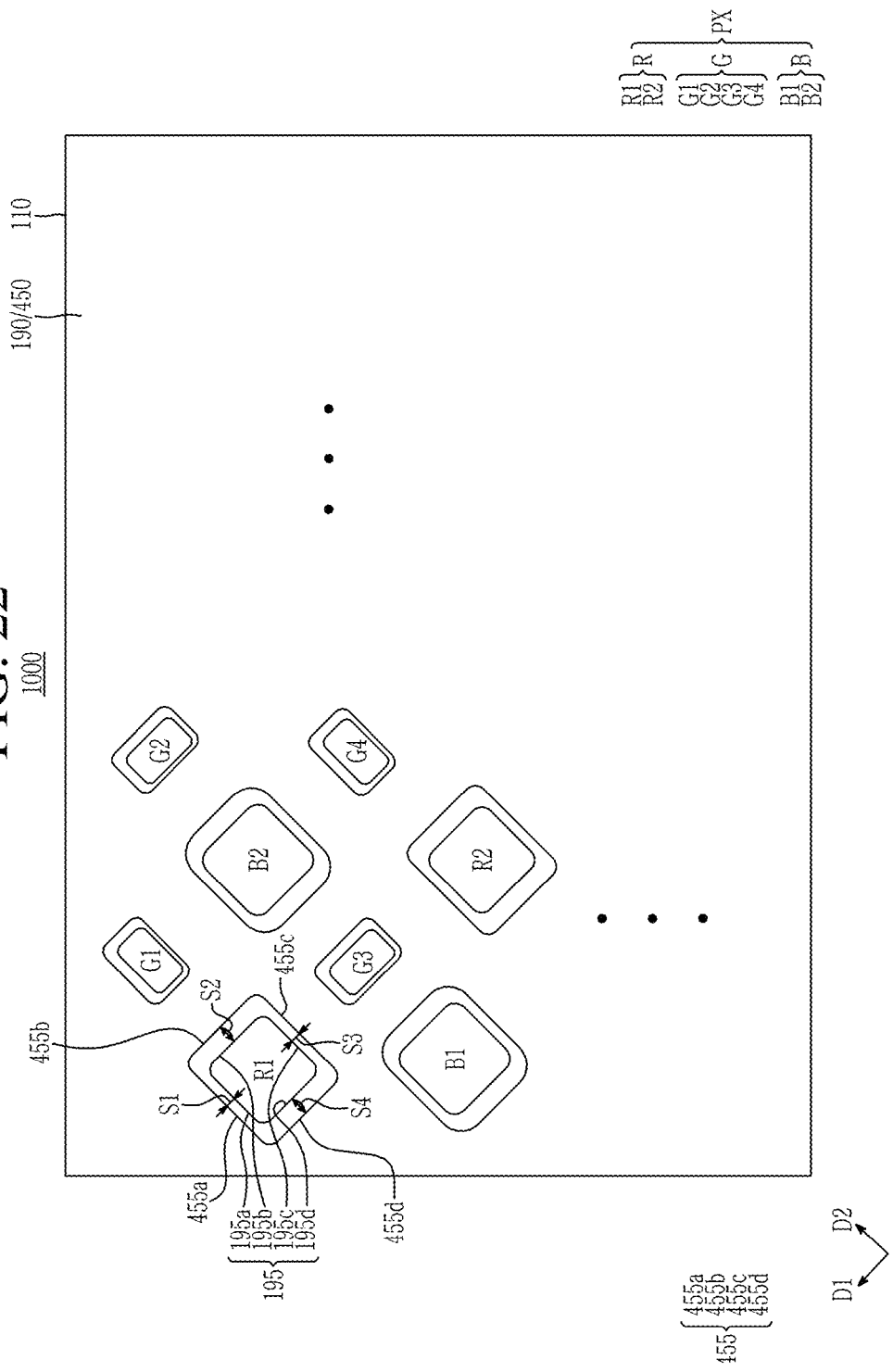

DISPLAY DEVICE

CROSS-REFERENCE TO RELATED APPLICATION

This application claims priority to and the benefit of Korean Patent Application No. 10-2020-0022890 filed in the Korean Intellectual Property Office on Feb. 25, 2020, the entire contents of which are incorporated herein by reference.

BACKGROUND

1. Field

The present disclosure relates to a display device.

2. Description of the Related Art

As a device displaying a screen, a display device includes a liquid crystal display (LCD), an organic light emitting diode (OLED) display, and the like. Such display devices are used in various electronic devices such as portable telephones, navigation devices, digital cameras, electronic books, portable game machines, or various terminals.

The display device is formed of a multi-layer structure. For example, the display device may be formed of a multi-layer structure in which light emitting elements, touch sensors, etc. are stacked on a substrate. The screen may be displayed by the light emitted from the light emitting element passing through these layers and being emitted to the outside of the display device. However, some of the light generated from the light emitting element may be obstructed without being emitted to the outside, such as by being reflected from the interlayer interface. Accordingly, there is a problem in light emission efficiency and display deterioration of the display device.

The above information disclosed in this Background section is only for enhancement of understanding of the background of the described technology, and therefore it may contain information that does not form the prior art that is already known in this country to a person of ordinary skill in the art.

SUMMARY

Exemplary embodiments have been made in an effort to provide a display device that can improve light emission efficiency and display quality.

In addition, exemplary embodiments provide a display device that can prevent light emission efficiency from being decreased even if an error occurs in the process of manufacturing the display device, such as a case in which a line width error occurs in some layers in a multi-layer structure and thus the layers are patterned in size that is different from the intended design, a case in which a misalignment of masks occur in forming of some layers and thus the overlapping position between multi-layered is different from the design, and the like.

A display device according to an exemplary embodiment includes: a substrate; a first electrode on the substrate; a partitioning wall on the first electrode and includes a first opening that overlaps the first electrode; a touch detection electrode on the partitioning wall; a low refractive layer on the partitioning wall and the touch detection electrode, and that includes a second opening that overlaps the first opening; and a high refractive layer on the low refractive layer, wherein planar shapes of the first opening and the second opening are polygons, each including a series of sides, and a distance between one side of the first opening and the second opening is different than another side of the first opening and the second opening in a plan view.

The display device according to the exemplary embodiment further includes a series of pixels on the substrate, wherein the series of pixels may include first color pixels, second color pixels, and third color pixels, and the first electrode, the first opening, and the second opening may be provided at each of the series of pixels.

The first opening may be smaller than the second opening in size in the plan view, and the first opening may be in the second opening.

Corners of the first opening and the second opening may be chamfered with a curved line.

A planar shape of the first opening may be a quadrangle including a first side, a second side adjacent to the first side in a clockwise direction, a third side adjacent to the second side in the clockwise direction, and a fourth side adjacent to the third side in the clockwise direction.

A planar shape of a first opening of at least one of the series of pixels may be a square, a first separation distance between the first side of the first opening and the second opening may be different than a second separation distance between the second side of the first opening and the second opening, the first separation distance may be the same as a third separation difference between the third side of the first opening and the second opening, and the second separation distance may be the same as a fourth separation distance between the fourth side of the first opening and the second opening.

A planar shape of a first opening of another pixel among the series of pixel may be a rectangle, the first separation distance may be the same as the second separation distance, the first separation distance may be different than the third separation distance, and the third separation distance may be the same as the fourth separation distance.

A planar shape of the first openings at the first color pixel and the second color pixel may be a square, a planar shape of the first opening at the second color pixel may be a rectangle, and the first color pixel may be a red pixel, the second color pixel may be a green pixel, and the third color pixel may be a blue pixel.

The first separation distance at the first color pixel may be the same as at least one of the first separation distance, the second separation distance, the third separation distance, and the fourth separation distance at the second pixel, and the first separation distance at the first color pixel may be the same as at least one of the first separation distance, the second separation distance, the third separation distance, and the fourth separation distance at the third color pixel.

At least one of the first separation distance, the second separation distance, the third separation distance, and the fourth separation distance may be about 1.4 µm or more and less than about 2.3 µm, and another among the first separation distance, the second separation distance, the third separation distance, and the fourth separation distance may be about 0.3 µm or more and less than about 1.2 µm.

In a pixel at which a planar shape of the first opening is a square, a difference between the first separation distance and the second separation distance may be about 0.2 µm or more and less than about 2.0 µm, and in a pixel at which a planar shape of the first opening is a rectangle, a difference between the first separation distance and the third separation distance may be about 0.2 µm or more and less than about 2.0 µm.

In pixels at which planar shapes of the first openings are squares, the first separation distance may be larger than the second separation distance, and in other pixels, the first separation distance may be smaller than the second separation distance.

The number of pixels at which the first separation distance may be larger than the second separation distance is the same as the number of pixels at which the first separation distance is smaller than the second separation distance.

In pixels at which the planar shapes of the first openings are rectangles, the first separation distance may be larger than the third separation distance, and in other pixels, the first separation distance may be smaller than the third separation distance.

The number of pixels at which the first separation distance is larger than the third separation distance may be the same as the number of pixels at which the first separation distance is smaller than the third separation distance.

The first separation distance at the first color pixel may be different than the first separation distance, the second separation distance, the third separation distance, and the fourth separation distance at the second color pixel.

The first separation distance at the first color pixel may be different than the first separation distance, the second separation distance, the third separation distance, and the fourth separation distance at the third color pixel.

A planar shape of the first opening may be an octagon including a first side, a second side adjacent to the first side in a clockwise direction, a third side adjacent to the second side in the clockwise direction, a fourth side adjacent to the third side in the clockwise direction, a fifth side adjacent to the fourth side in the clockwise direction, a sixth side adjacent to the fifth side in the clockwise direction, a seventh side adjacent to the sixth side in the clockwise direction, and an eighth side adjacent to the seventh side in the clockwise direction.

A first separation distance between the first side of the first opening and the second opening may be the same as a second separation distance between the second side of the first opening and the second opening, the first separation distance may be the same as a third separation distance between the third side of the first opening and the second opening, the first separation distance may be the same as a fourth separation distance between the fourth side of the first opening and the second opening, a fifth separation distance between the fifth side of the first opening and the second opening may be the same as a sixth separation distance between the sixth side of the first opening and the second opening, the fifth separation distance may be the same as a seventh separation distance between the seventh side of the first opening and the second opening, the fifth separation distance may be the same as an eighth separation distance between the eighth side of the first opening and the second opening, and the first separation distance may be different than the fifth separation distance.

Corners of the first opening and the second opening may be chamfered with a curved line.

According to the exemplary embodiments, light emission efficiency and display quality of the display device can be improved.

In addition, even of an error occurs in a manufacturing process of the display device, light emission efficiency can be prevented from being decreased.

BRIEF DESCRIPTION OF THE DRAWINGS

FIG. 21 is a schematic top plan view of a display device according to an exemplary embodiment.

FIG. 22 is a schematic top plan view of a display device according to an exemplary embodiment.

DETAILED DESCRIPTION

Figure 1:
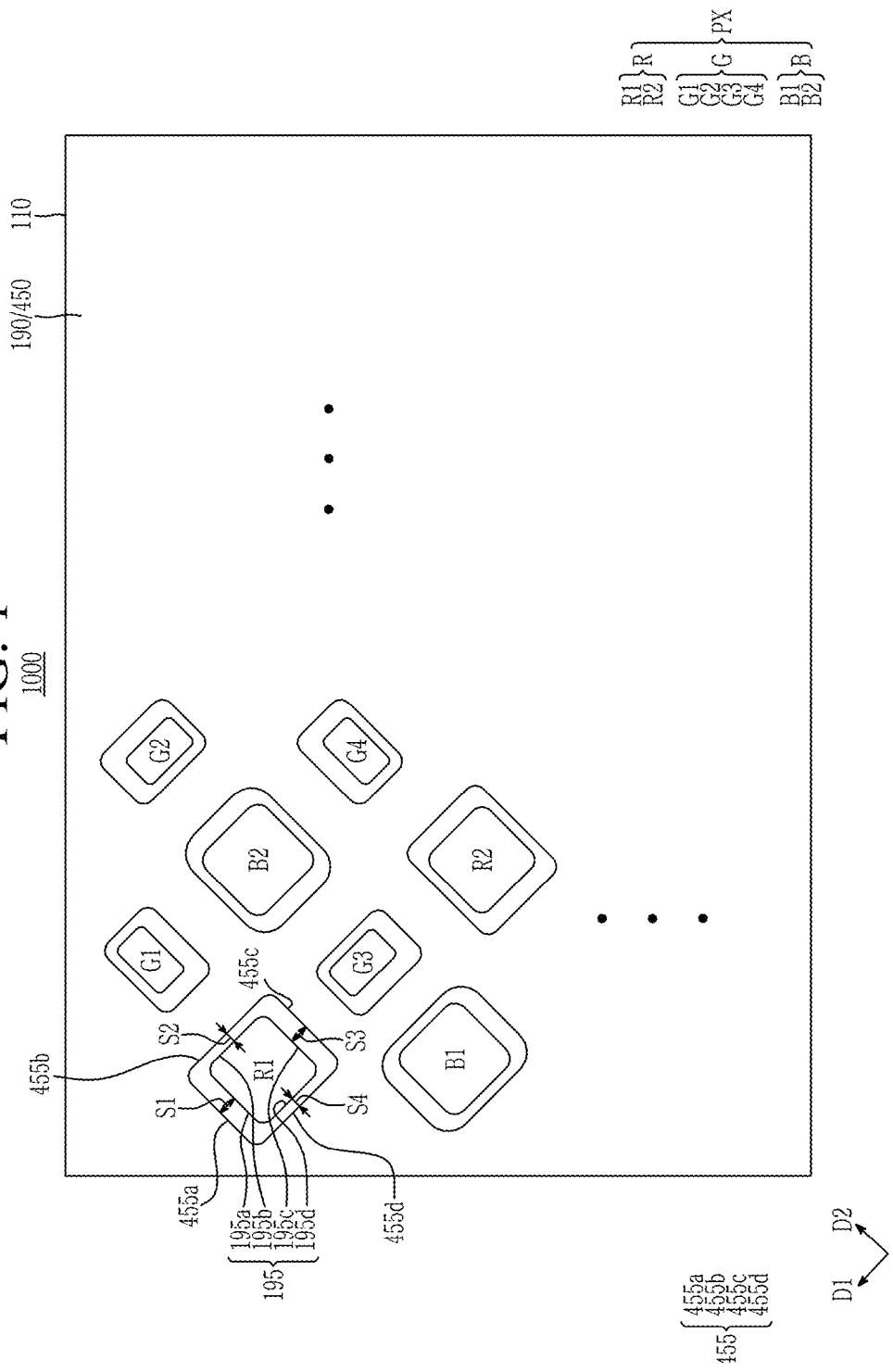
FIG. 1 is a schematic top plan view of a display device according to an exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

Further, in the drawings, size and thickness of each element are arbitrarily represented for better understanding and ease of description, but the present invention is not limited thereto. In the drawings, the thickness of layers, films, panels, regions, etc., are exaggerated for clarity. In the drawing, the thickness of some layers and regions is exaggerated for better understanding and ease of description.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

In addition, unless explicitly described to the contrary, the word "comprise", and variations such as "comprises" or "comprising" will be understood to imply the inclusion of stated elements but not the exclusion of any other elements.

Further, in this specification, the phrase "on a plane" means viewing a target portion from the top, and the phrase "on a cross-section" means viewing a cross-section formed by vertically cutting a target portion from the side.

First, referring to FIG. 1, a display device according to an exemplary embodiment will be described.

FIG. 1 is a schematic top plan view of a display device according to an exemplary embodiment.

As shown in FIG. 1, a display device 1000 according to an exemplary embodiment includes a substrate 110, and a partitioning wall 190 and a low refractive layer 450 that overlap the substrate 110. The partitioning wall 190 may include first openings 195, and the low refractive layer 450 may include second openings 455.

A plurality of pixels PX are located on the substrate 110, and the first opening 195 and the second opening 455 may be located at each of the plurality of pixels PX. The plurality of pixels PX may include red pixels R, green pixels G, and blue pixels B.

The red pixel R may display red, the green pixel G may display green, and the blue pixel B may display blue. However, this is only one example, and the plurality of pixel PX may be formed of pixels displaying colors other than red, green, and blue. For example, the plurality of pixel PX may include a pixel displaying cyan, a pixel displaying magenta, and a pixel displaying yellow.

A planar shape of each of the first opening 195 and the second opening 455 may be approximately a polygon including a plurality of sides. For example, the first opening 195 and the second opening 455 may be respectively formed in the shape of a quadrangle on a plane. The first opening 195 and the second opening 455 may be respectively formed in the shape of a quadrangle including two sides that are parallel with a first direction D1 and two sides that are parallel with a second direction D2. The second direction D2 may be a direction that is perpendicular to the first direction D1. Thus, the first opening 195 and the second opening 455 may be formed in the shape of a rectangle. On a plane of the display device 1000, the size of the first opening 195 may be smaller than the size of the second opening 455. In this embodiment, the first opening 195 may be disposed inside the second opening 455. Corner portions of each of the first opening 195 and the second opening 455 may be chamfered into a curved line. However, the corner portions of each of the first opening 195 and the second opening 455 may have any other suitable shape or shapes. For example, the corner portions of the first opening 195 and the corner portions of the second opening 455 may be chamfered into a straight line.

The first opening 195 may include a first side 195a, a second side 195b that is adjacent in the clockwise direction with reference to the first side 195a, a third side 195c that is adjacent in the clockwise direction with reference to the second side 195b, and a fourth side 195d that is adjacent in the clockwise direction with reference to the third side 195c. The fourth side 195d of the first opening 195 may be adjacent to the first side 195a. The second opening 455 may include a first side 455a, a second side 455b that is adjacent in the clockwise direction with reference to the first side 455a, a third side 455c that is adjacent in the clockwise direction with reference to the second side 455b, and a fourth side 455d that is adjacent in the clockwise direction with reference to the third side 455c. The fourth side 455d of the second opening 455 may be adjacent to the first side 455a. The first side 195a of the first opening 195 may be adjacent or proximate to the first side 455a of the second opening 455, and they may be parallel or substantially parallel with each other. The second side 195b of the first opening 195 may be adjacent or proximate to the second side 455b of the second opening 455, and they may be parallel or substantially parallel with each other. The third side 195c of the first opening 195 may be adjacent or proximate to the third side 455c of the second opening 455, and they may be parallel or substantially parallel with each other. The fourth side 195d of the first opening 195 may be adjacent or proximate to the fourth side 455d of the second opening 455, and they may be parallel or substantially parallel with each other.

In this embodiment, a shortest separation distance between the first side 195a of the first opening 195 and the second opening 455 is defined as a first separation distance S1. That is, the first separation distance S1 refers to the shortest separation distance (i.e., a straight-line separation distance) between the first side 195a of the first opening 195 and the first side 455a of the second opening 455. In addition, a shortest separation distance between the second side 195b of the first opening 195 and the second opening 455 is defined as a second separation distance S2. That is, the second separation distance S2 refers to the shortest separation distance (i.e., a straight-line separation distance) between the second side 195b of the first opening 195 and the second side 455b of the second opening 455. In addition, a shortest separation distance between the third side 195c of the first opening 195 and the second opening 455 is defined as a third separation distance S3. That is, the third separation distance S3 refers to the shortest separation distance (i.e., a straight-line separation distance) between the third side 195c of the first opening 195 and the second opening 455. In addition, a shortest separation distance between the fourth side 195d of the first opening 195 and the second opening 455 is defined as a fourth separation distance S4. That is, the fourth separation distance S4 refers to the shortest separation distance (i.e., a straight-line separation distance) between the fourth side 195d of the first opening 195 and the fourth side 455d of the second opening 455.

For any given pixel PX, the shortest separation distance between one side of the first opening 195 and the second opening 455 may be different than the shortest separation distance between another side of the first opening 195 and the second opening 455. For example, the first separation distance S1 and the second separation distance S2 in a red pixel R may be different from each other. In addition, the first separation distance S1 and the third separation distance S3 in a green pixel G may be different from each other. In addition, the first separation distance S1 and the second separation distance S2 in a blue pixel B may be different from each other.

The first to fourth separation distances S1, S2, S3, and S4 within each pixel PX will be described in detail later.

The red pixel R may include a first red pixel R1 and a second red pixel R2. The first opening 195 located at the first red pixel R1 and the first opening 195 located at the second red pixel R2 may have the same shape or a similar shape. The second opening 455 located at the first red pixel R1 and the second opening 455 located at the second red pixel R2 may have the same shape or a similar shape, although the orientation of the second opening 455 located at the first red pixel R1 may have a different orientation that the second opening 455 at the second red pixel R2.

The green pixel G may include a first green pixel G1, a second green pixel G2, a third green pixel G3, and a fourth green pixel G4. The first opening 195 located at the first green pixel G1 and the first opening 195 located at the fourth green pixel G4 may have the same shape or a similar shape. The second opening 455 located at the first green pixel G1 and the second opening 455 located at the fourth green pixel G4 may have the same shape or a similar shape. The first opening 195 located at the second green pixel G2 and the first opening 195 located at the third green pixel G3 may have the same shape or a similar shape. The second opening 455 located at the second green pixel G2 and the second opening 455 located at the third green pixel G3 may have the same shape or a similar shape. The first opening 195 located at the first green pixel G1 and the first opening 195 located at the second green pixel G2 may have the same shape or a similar shape, although the orientation of the first opening 195 located at the first green pixel G1 may be different than the orientation of the first opening 195 located at the second green pixel G2. The second opening 455 located at the first green pixel G1 and the second opening 455 located at the second green pixel G2 have the same shape or a similar shape, although the orientation of the second opening 455 located at the first green pixel G1 may be different than the orientation of the second opening 455 located at the second green pixel G2.

The blue pixel B may include a first blue pixel B1 and a second blue pixel B2. The first opening 195 located at the first blue pixel B1 and the first opening 195 located at the second blue pixel B2 may have the same shape or a similar shape. The second opening 455 located at the first blue pixel B1 and the second opening 455 located at the second blue pixel B2 may have the same shape or a similar shape, although the orientation of the second opening 455 located at the first blue pixel B1 may be different than the orientation of the second opening 455 at the second blue pixel B2.

In one or more embodiments, for each pixel, the first opening 195 and the second opening 455 are substantially formed in the shape of a rectangle, but they may have different sizes, and this will be described in detail later.

Next, referring to FIG. 2 to FIG. 6, a structure of a display device according to an exemplary embodiment will be described in detail.

Figure 2:
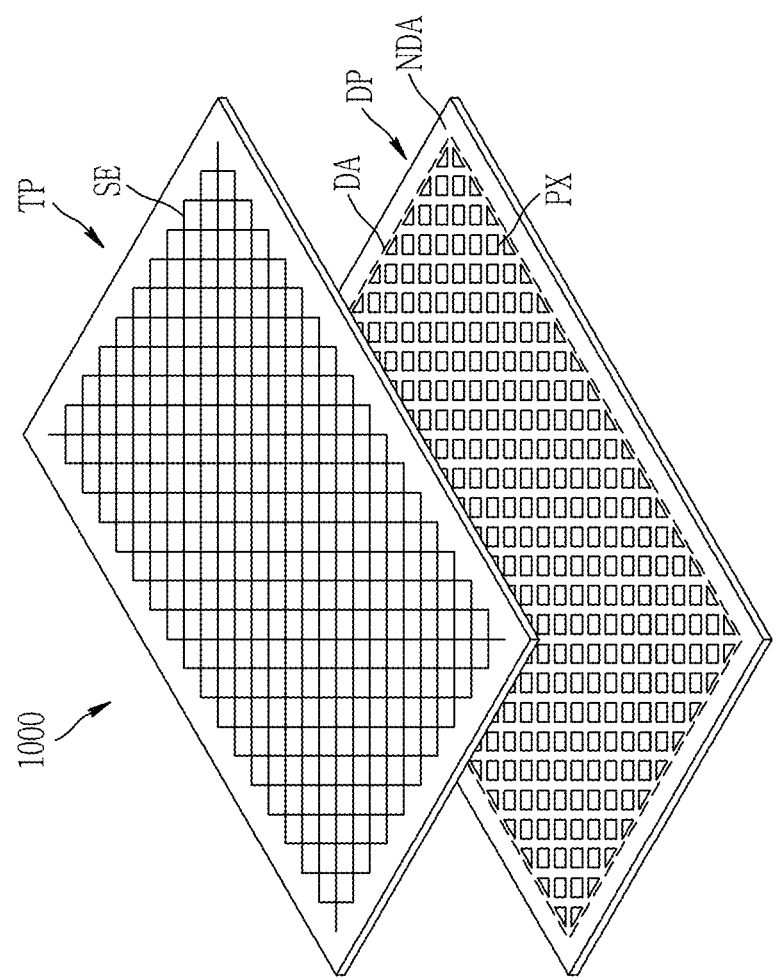
FIG. 2 is a perspective view of a display device according to an exemplary embodiment.
Figure 3:
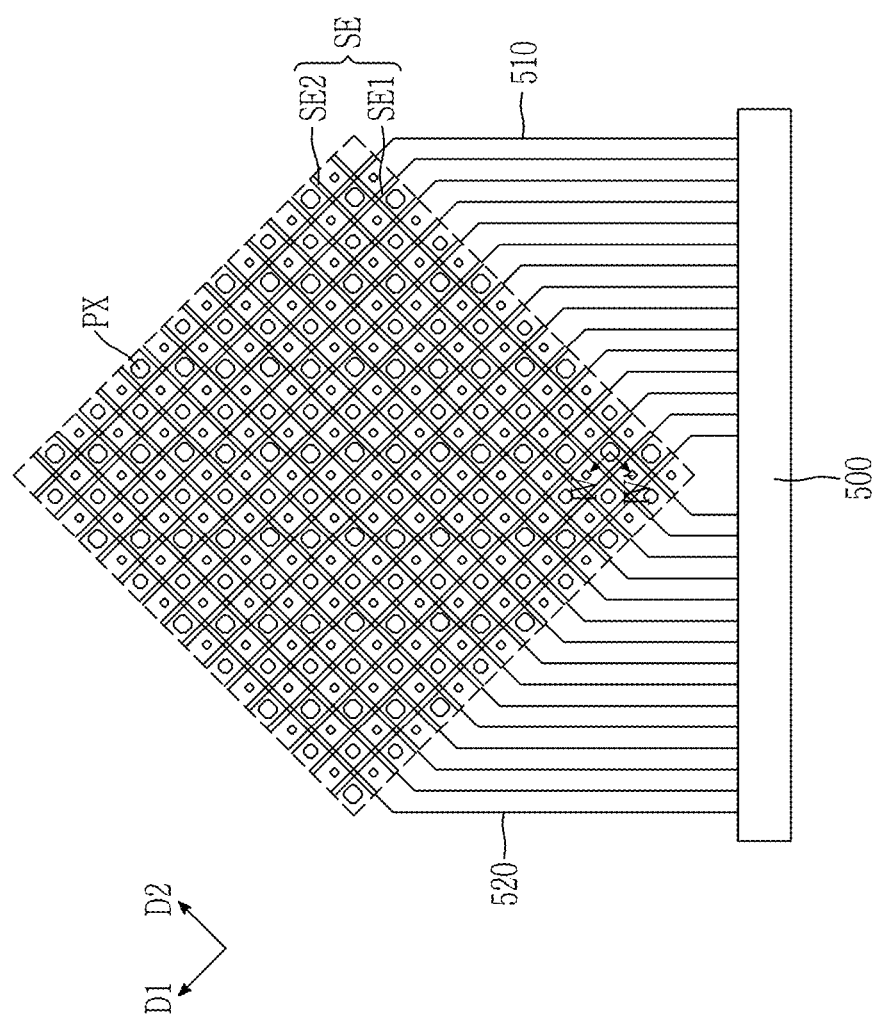
FIG. 3 is a top plan view of some area of FIG. 2.
Figure 4:
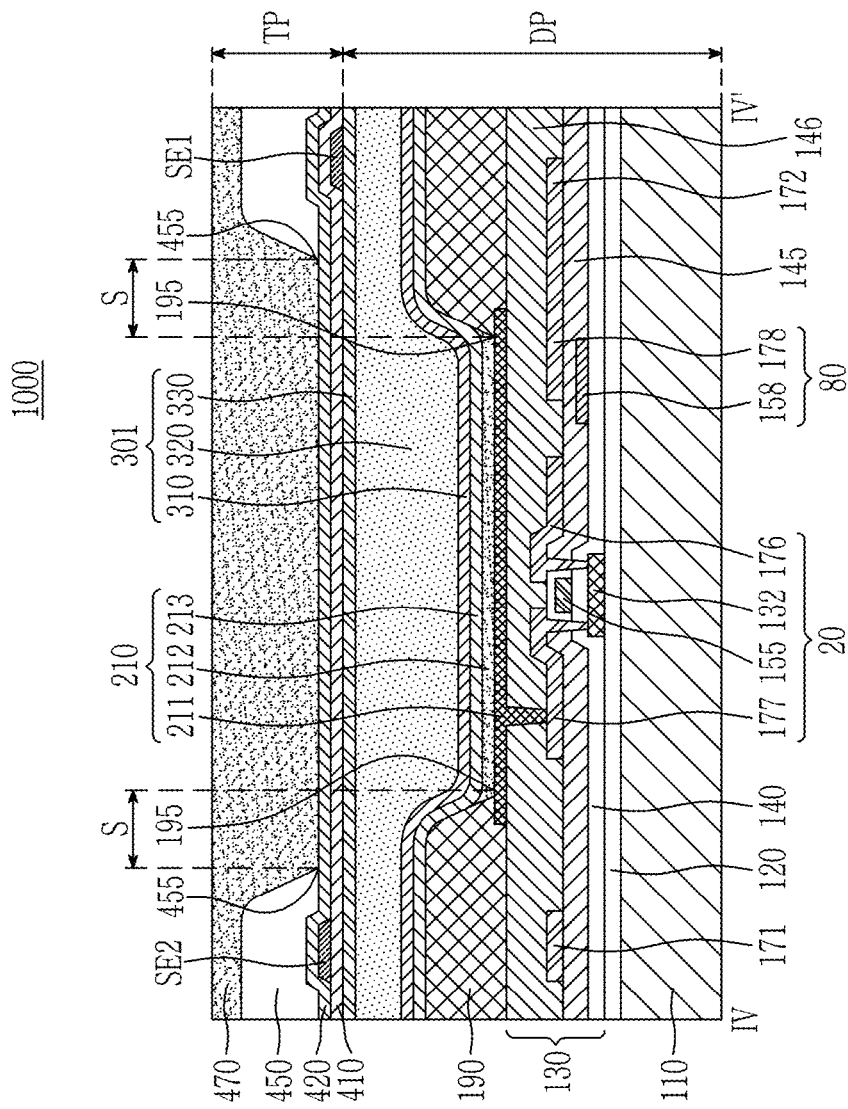
FIG. 4 is a cross-sectional view of FIG. 3, taken along the line IV-IV'.
Figure 5:
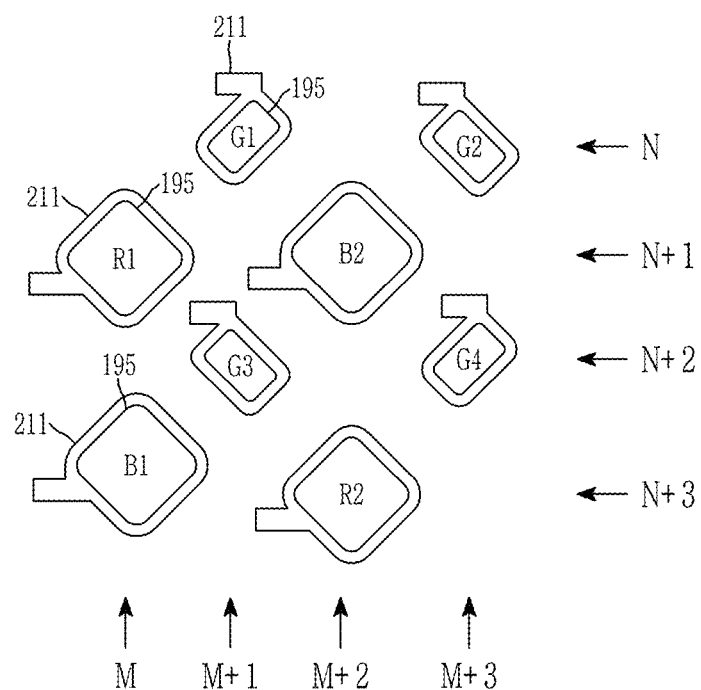
FIG. 5 is a schematic top plan view of a plurality of first electrodes and a plurality of first openings in the display device according to the exemplary embodiment.
Figure 6:
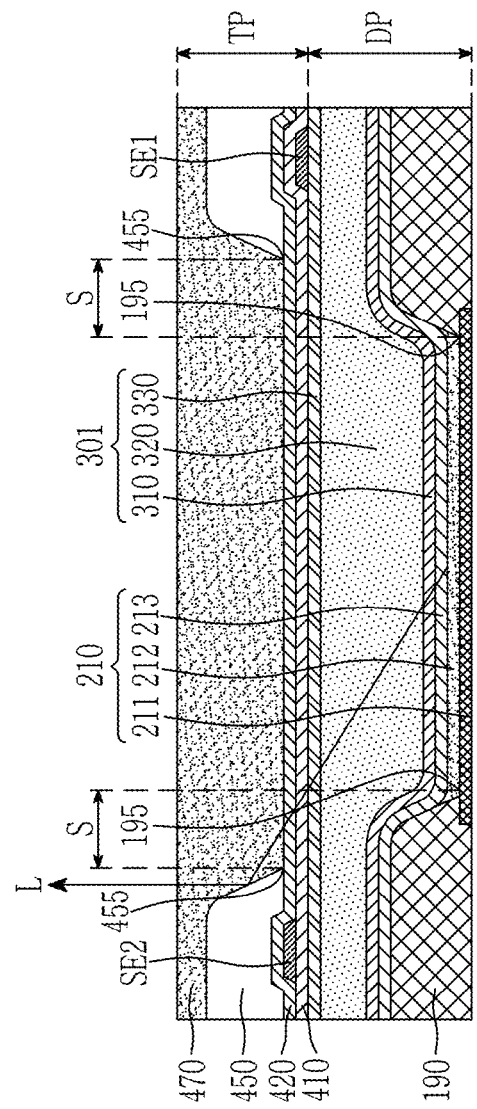
FIG. 6 is a cross-sectional view that shows reflection of light in the display device according to the exemplary embodiment.

FIG. 2 is a perspective view of a display device according to an exemplary embodiment, and FIG. 3 is a top plan view of an area of the display device depicted in FIG. 2. FIG. 4 is a cross-sectional view of FIG. 3, taken along the line IV-IV', FIG. 5 is a schematic top plan view of a plurality of first electrodes and a plurality of first openings in the display device according to the exemplary embodiment, and FIG. 6 is a cross-sectional view that shows reflection of light in the display device according to the exemplary embodiment.

As shown in FIG. 2, a display device 1000 according to an exemplary embodiment includes a display portion DP and a touch portion TP. In this embodiment, the display portion DP and the touch portion TP are illustrated to be formed separate from each other for convenience of description, but the display portion DP and the touch portion TP of the display device 1000 are integrally formed. In one embodiment, the display device 1000 may have an on-cell structure in which the touch portion TP is disposed directly on the display portion DP without a separate substrate. However, the present disclosure is not limited thereto, and the display device 1000 may have an in-cell structure in which the touch portion TP is disposed inside the display portion DP, or may have an add-on type structure in which the touch portion TP is formed in a separate panel, which is attached on the display portion DP.

The display portion DP may be divided into a display area DA and a non-display area NDA. The display portion DP includes a plurality of pixels PX arranged in a matrix format. The plurality of pixels PX are shown as being formed in the shape of an approximately quadrangle, but are not limited thereto, and a plurality of pixels PX may have various forms.

The touch portion TP may be on the display portion DP. The touch portion TP includes at least one sensing electrode SE for detecting whether or not a touch is made and for determining the touch coordinates.

As shown in FIG. 3, the sensing electrode SE includes first sensing electrodes SE1 extending in a first direction D1, and second sensing electrodes SE2 extending in a second direction D2 that crosses the first direction D1.

The first sensing electrodes SE1 and the second sensing electrodes SE2 may be arranged in a form or configuration surrounding the pixels PX on a plane.

For example, one pixel PX may be surrounded by the first sensing electrode SE1 and the second sensing electrode SE2 on a plane. However, the present disclosure is not limited thereto, and the first sensing electrode SE1 and the second sensing electrode SE2 may surround four pixels PX, which form one pixel group, on a plane. Accuracy in touch sensing may be changed depending on the degree of density of the first sensing electrode SE1 and the second sensing electrode SE2.

In addition, the first sensing electrode SE1 and the second sensing electrode SE2 are formed in the shape of a mesh electrode on a plane, but the present disclosure is not limited thereto, and each of the first sensing electrode SE1 and the second sensing electrode SE2 may have a planar electrode shape.

The first sensing electrode SE1 and the second sensing electrode SE2 may respectively include a metal or a transparent conductivity oxide (TCO). Such a transparent conductivity oxide (TCO) may include at least one of indium-tin oxide (ITO), indium-zinc oxide (IZO), zinc oxide (ZnO), a carbon nanotubes (CNT), and graphene.

The first sensing electrode SE1 may be electrically connected with a first routing wire 510, and the second sensing electrode SE2 may be electrically connected with a second routing wire 520. The first routing wire 510 and the second routing wire 520 may both be connected to a touch driver 500. In this embodiment, it is illustrated that the first routing wire 510 and the second routing wire 520 are connected to one touch driver 500, but the present disclosure is not limited thereto, and the first routing wire 510 and the second routing wire 520 may be respectively connected to separate touch drivers 500.

The touch driver 500 may determine whether a touch is made and to determine the touch coordinates by inputting a driving signal to the first sensing electrode SE1 and using a capacitance change amount or voltage change amount measured by the second sensing electrode SE2. The touch driver 500 may be directly on a substrate in the form of an integrated circuit (IC), or may be made in a separate configuration.

As shown in FIG. 4, a display device 1000 according to an exemplary embodiment includes a display portion DP and a touch portion TP on the display portion DP.

The display portion DP includes a substrate 110, a driving circuit 130, a partitioning wall 190, a light emitting element 210, and a thin film encapsulation layer 301.

The substrate 110 may be made of an insulating material such as glass, quartz, ceramic, and plastic. The substrate 110 may be flexible.

A buffer layer 120 may be disposed on the substrate 110. The buffer layer 120 may include an inorganic layer or an organic layer, and may be formed of a single layer or multiple layers. The buffer layer 120 prevents permeation of unnecessary components such as an impurity and/or moisture into the driving circuit 130 or the light emitting element 210 and also planarizes the surface. However, the buffer layer 120 may be omitted.

The driving circuit 130 may be disposed on the buffer layer 120. The driving circuit 130 is a portion that includes a plurality of thin film transistors 20 and a capacitor 80, and may drive the light emitting element 210. In addition, the driving circuit 130 may further include a gate line (not shown) extending along one direction, and a data line 171 and a common power line 172 that cross the gate line in an insulated manner.

The light emitting element 210 display an image by emitting light according to a driving signal transmitted from the driving circuit 130.

The display device 1000 according to the exemplary embodiment may have a 2Tr-1Cap structure including two thin film transistors 20 and one capacitor 80 in a single pixel PX, or may have a structure including three or more thin film transistors 20 and two or more capacitors 80 in a single pixel PX. The structure of thin film transistor 20 and capacitor 80 constituting one pixel PX may be variously changed.

The capacitor 80 may include a pair of capacitor plates 158 and 178 and an interlayer insulating layer 145 therebetween. In one embodiment, the interlayer insulating layer 145 is a dielectric material. Capacitance is determined by a charge stored in capacitor 80 and a voltage difference between the two capacitor plates 158 and 178.

The thin film transistor 20 may include a semiconductor 132, a gate electrode 155, a source electrode 176, and a drain electrode 177. The semiconductor 132 and the gate electrode 155 may be insulated by a gate insulating layer 140. The thin film transistor 20 may apply driving power to a first electrode 211 for light emission from an emission layer 212 of a light emitting element 210 in a selected pixel PX. In this embodiment, the gate electrode 155 may be connected with the capacitor plate 158, the source electrode 176 and the other capacitor plate 178 are respectively connected to the common power line 172, and the drain electrode 177 may be connected to the first electrode 211 of the light emitting element 210 through an opening in a planarization layer 146.

The planarization layer 146 may be on the interlayer insulating layer 145. The planarization layer 146 is made of an insulating material, and may protect the driving circuit 130. The planarization layer 146 and the interlayer insulating layer 145 may include the same material.

The first electrode 211 may be on the planarization layer 146. The first electrode 211 may be a pixel electrode, and may be an anode. The first electrode 211 has conductivity, and may be a transmissive electrode, a semi-transmissive electrode, or a reflective electrode.

The partitioning wall 190 that partitions a light emission area may be on the planarization layer 146 and the first electrode 211. In this embodiment, the light emission area is also called a pixel area. The partitioning wall 190 may include an organic polymer material. For example, the partitioning wall 190 may include at least one of a polyimide-based resin, a polyacryl-based resin, a polyethylene terephthalate (PET) resin, and a polyethylene naphthalate (PEN) resin.

The partitioning wall 190 includes a first opening 195. The first opening 195 defines a portion where the first electrode 211 is not covered by the partitioning wall 190. The first opening 195 may overlap the first electrode 211. An edge of the first electrode 211 may overlap the partitioning wall 190.

Referring to FIG. 5, the partitioning wall 190 includes a plurality of first openings 195 respectively corresponding to the plurality of pixels PX. The plurality of pixels PX may include red pixels R, green pixels G, and blue pixels B. In this embodiment, a light emitting element 210 of the red pixel R may include a red emission layer, a light emitting element 210 of the green pixel G may include a green emission layer, and a light emitting element 210 of the blue pixel B may include a blue emission layer.

Each of the plurality of first openings 195 may have a shape that is similar to the first electrode 211 on a plane of the display device 1000. For example, the first opening 195 and the first electrode 211 may be formed in the shape of a polygon on a plane of the display device 1000. In this embodiment, corners of the first opening 195 and first electrode 211 may be chamfered as a curved line. However, the shape of the corners of the first opening 195 and first electrode 211 is not limited thereto, and may be variously changed.

In this embodiment, the plurality of first pixels 211 respectively corresponding to the red pixel R, the green pixel G, and the blue pixel B may have different sizes on a plane of the display device 1000. Likewise, the plurality of first openings 195 respectively corresponding to the red pixel R, the green pixel G, and the blue pixel B may have different sizes on a plane of the display device 1000. For example, the first opening 195 and the first electrode 211 corresponding to the red pixel R may be larger in size than the first opening 195 and the first electrode 211 corresponding to the green pixel G on a plane of the display device. In addition, the first opening 195 and the first electrode 211 corresponding to the red pixel R may be smaller than or similar in size to the first opening 195 and the first electrode 211 corresponding to the blue pixel B on a plane of the display device 1000. However, the present disclosure is not limited thereto, and each of the first openings 195 and each of the first electrodes 211 may have various shapes and sizes.

In addition, the display device 1000 according to the exemplary embodiment may have a pentile structure (e.g., an RG-BG arrangement of subpixels). For example, a plurality of first electrodes 211 corresponding to the green emission layer may be disposed at predetermined intervals in an N-th row, and a first electrode 211 corresponding to the red emission layer and a first electrode 211 corresponding to the blue emission layer may be disposed alternately in an adjacent (N+1)-th row. Likewise, a plurality of first electrodes 211 corresponding to a green emission layer are arranged at predetermined intervals in an adjacent (N+2)th row, and a first electrode 211 corresponding to the blue emission layer and a first electrode 211 corresponding to the red emission layer may be alternately arranged in an adjacent (N+3)th row.

In addition, the first electrodes 211 corresponding to a plurality of green emission layers arranged in the N-th row may be displaced alternately (e.g., staggered laterally) with the first electrodes 211 corresponding to the plurality of red and blue emission layers in the (N+1)th row. For example, first electrodes 211 that correspond to the red and blue emission layers are alternately arranged in an M-th column, and first electrodes 211 corresponding to the plurality of green emission layers may be arranged at predetermined intervals in an adjacent (M+1)th column. Likewise, the first electrodes 211 corresponding to the blue and red emission layers are alternately arranged in an adjacent (M+2)th column, and first electrodes 211 corresponding to the plurality of green emission layers may be arranged at predetermined intervals in an adjacent (M+3)th column. In one embodiment, the plurality of first electrodes 211 may be repeatedly arranged with the above-stated structure on the substrate 110.

Referring back to FIG. 4, the emission layer 212 may be on the first electrode 211. The emission layer 212 is in the first opening 195 of the partitioning wall 190 and may overlap the first electrode 211. The emission layer 212 includes a light emitting material. The light emitting material may be an organic material or an inorganic material such as a quantum dot. In addition, the emission layer 212 may include a host and a light emitting dopant.

A second electrode 213 may be disposed on the emission layer 212. The second electrode 213 may be a common electrode, and may be a cathode. The second electrode 213 may be a transmissive electrode, a semi-transmissive electrode, or a reflective electrode.

Although it is not illustrated, at least one of a hole injection layer HIL and a hole transport layer HTL may be disposed between the first electrode 211 and the emission layer 212, and at least one of an electron transport layer ETL and an electron injection layer EIL may be disposed between the emission layer 212 and the second electrode 213.

A thin film encapsulation layer 301 may be disposed on the second electrode 213 to protect the light emitting element 210. The thin film encapsulation layer 301 may prevent moisture or oxygen from penetrating the light emitting element 210.

The thin film encapsulation layer 301 may include at least one of inorganic layers 310 and 330 and at least one organic layer 320. It is illustrated that the thin film encapsulation layer 301 includes two inorganic layers 310 and 330 and one organic layer 320, but the present disclosure is not limited thereto. In addition, an encapsulation substrate may be provided instead of the thin film encapsulation layer 301. In this embodiment, a sealing member may be between the substrate and the encapsulation substrate.

The inorganic layers 310 and 330 may include at least one inorganic material selected from $Al_2O_3$, $TiO_2$, $ZrO$, $SiO_2$, $AlON$, $AlN$, $SiON$, $Si_3N_4$, $ZnO$, and $Ta_2O_5$. The organic layer 320 may include a polymer-based material. The polymer-based material may include an acryl-based resin, polyimide, an epoxy-based resin, polyethylene, and the like.

The dense inorganic layers 310 and 330 can suppress or mitigate against the penetration of moisture or oxygen. Moisture or oxygen penetrating through the inorganic layers 310 and 330 can be blocked by the organic layer 320. In addition to the moisture permeation suppression, the organic layer 320 also serves as a buffer layer that reduces stress between inorganic layers 310 and 330. In addition, the organic layer 320 has a planarization characteristic, and thus the top surface of the thin film encapsulation layer 301 may be flattened by the organic layer 320.

The thin film encapsulation layer 301 may have a thickness of about 5 μm to about 50 μm. However, the thickness of the thin film encapsulation layer 301 is not limited thereto.

The display portion DP including the substrate 110, the driving circuit 130, the partitioning wall 190, the light emitting element 210, and the thin film encapsulation layer 301 may be formed into an organic light emitting panel. However, the type of the display portion DP is not limited thereto, and the display portion DO may be formed of various types of panels. For example, the display portion DP may be formed of a liquid crystal display panel, an electrophoretic display panel, an electrowetting display panel, a micro light emitting diode (Micro LED) display panel, a quantum dot light emitting diode (QLED) display panel, a quantum dot organic light emitting diode (OLED) (QD-OLED) display panel, and the like.

A first sensing electrode SE1 may be disposed on the thin film encapsulation layer 301. A first insulation layer 410 may be disposed on the first sensing electrode SE1 and the thin film encapsulation layer 301. The first insulation layer 410 may include at least one or more of the inorganic layer and the organic layer. The inorganic layer may include at least one of silicon oxide, silicon nitride, and silicon oxynitride. The organic layer may include a polymer-based material. A second sensing electrode SE2 may be disposed on the first insulation layer 410.

In the above description, the touch portion TP is described as including the first sensing electrode SE1 and the second sensing electrode SE2 on different layers, but the present disclosure is not limited thereto. For example, the touch portion TP may include a first sensing electrode SE1 and a second sensing electrode SE2 on the same layer and connected using a bridge electrode.

A second insulation layer 420 may be on the second sensing electrode SE2 and the first insulation layer 410. The second insulation layer 420 may include at least one or more of the organic layer and the inorganic layer.

A low refractive layer 450 is on the second insulation layer 420. The low refractive layer 450 may include a light transmissive organic material having a low refractive index. For example, the low refractive layer 450 may include at least one of an acryl resin, a polyimide resin, a polyamide resin, and Alq3 [tris(8-hydroxyquinolinato) aluminum]. The low refractive layer 450 may have a relatively lower refractive index than a high refractive layer 470. For example, the low refractive layer 450 may have a refractive index of about 1.40 to about 1.59.

The low refractive layer 450 includes a second opening 455. The second opening 455 defines a portion where the second insulation layer 420 is not covered by the low refractive layer 450. The second opening 455 may overlap the first opening 195.

A separation distance S between the first opening 195 and the second opening 455 refers to the shortest separation distance (i.e., a straight-line separation distance) between an edge of the opening 195 and an edge of the second opening 455. The edge of the first opening 195 refers to a point where the partitioning wall 190 contacts the first electrode 211. The edge of the second opening 455 refers to a point where the low refractive layer 450 contacts the second insulation layer 420. The separation distance S may include a first separation distance S1, a second separation distance S2, a third separation distance S3, and a fourth separation distance S4 defined above.

The high refractive layer 470 may be on the second insulation layer 420 and the low refractive layer 450. The high refractive layer 470 may include a light transmissive organic material having a high refractive index. The high refractive layer 470 may have a relatively larger refractive index than the low refractive layer 450. For example, the high refractive layer 470 may have a refractive index of about 1.60 to about 1.80.

The high refractive layer 470 may be in the second opening 455 of the low refractive layer 450. In this embodiment, the high refractive layer 470 contacts a side surface of the low refractive layer 450. Further, the high refractive layer 470 may also be on the top surface of the low refractive layer 450 so as to contact the top surface of the low refractive layer 450.

Although it is not illustrated, a polarization layer that includes a linear polarizer, a retarder, and the like may be on the touch portion TP. In addition, a cover window that protects the touch portion TP and the display portion DP may be on the touch portion TP. In this embodiment, an adhesive layer may be between the polarization layer and the cover window.

The touch portion TP includes the low refractive layer 450 including the second opening 455 and the high refractive layer 470 in the second opening 455 of the low refractive layer 450 such that the front visibility and light emission efficiency of the display device 1000 can be improved. That is, at least some of light emitted from the light emitting element 210 may be totally reflected at an interface between the low refractive layer 450 and the high refractive layer 470 such that the light can be focused on the front of the display device 1000.

This will be described in detail with reference to FIG. 6. FIG. 6 shows reflection of light at the interface between the low refractive layer 450 and the high refractive layer 470. Light L generated from the emission layer 212 of the light emitting element 210 may emit in various directions, and may enter the touch portion TP with various angles of incidence. In this case, at least a part of the light L incident on the high refractive layer 470 of the touch portion TP is reflected at the interface between the low refractive layer 450 and the high refractive layer 470. In one or more embodiments, the light L incident on the high refractive layer 470 may be totally reflected at the interface between the low refractive layer 450 and the high refractive layer 470 and emitted from the front of the display device 1000. That is, total light reflection at the interface between the low refractive layer 450 and the high refractive layer 470 may occur while the light L incident on the high refractive layer 470 that has a relatively large refractive index proceeds to the low refractive layer 450 that has a relatively small refractive index.

In one or more embodiments, the interface between the low refractive layer 450 and the high refractive layer 470 may form an angle of about 40 degrees to about 70 degrees relative to a straight line that is parallel with the substrate 110. In the illustrated embodiment, the angle between the lower refractive layer 450 and the high refractive layer 470 faces away from the second opening 455 of the low refractive layer 450. The interface between the low refractive layer 450 and the high refractive layer 470 may be a side surface (e.g., an angled or sloped side surface) of the low refractive layer 450 that includes the second opening 455. That is, the side surface of the low refractive layer 450 may form an angle of about 40 degrees to about 70 degrees with respect to the top surface of the second insulation layer 420.

When the angle is smaller than about 40 degrees, the light L mostly does not enter the interface of the low refractive layer 450 and the high refractive layer 470 and thus total reflection may not occur (e.g., less than a majority of the light L may be incident on the interface between the low refractive layer 450 and the high refractive layer 470). In addition, when the angle is greater than about 70 degrees, the light L totally reflected from the interface of the low refractive layer 450 and the high refractive layer 470 may not be emitted to the front of the display device 1000. Thus, the interface between the low refractive layer 450 and the high refractive layer 470 forms an angle of about 40 degrees to about 70 degrees relative to a straight line parallel with the substrate 110 such that light L incident on the interface between the low refractive layer 450 and the high refractive layer 470 is totally reflected, thereby being focused to the front side of the display device 1000. In this manner, the light output efficiency of the front of the display device 1000 can be improved compared to an otherwise comparable device without these feature(s).

Figure 7:
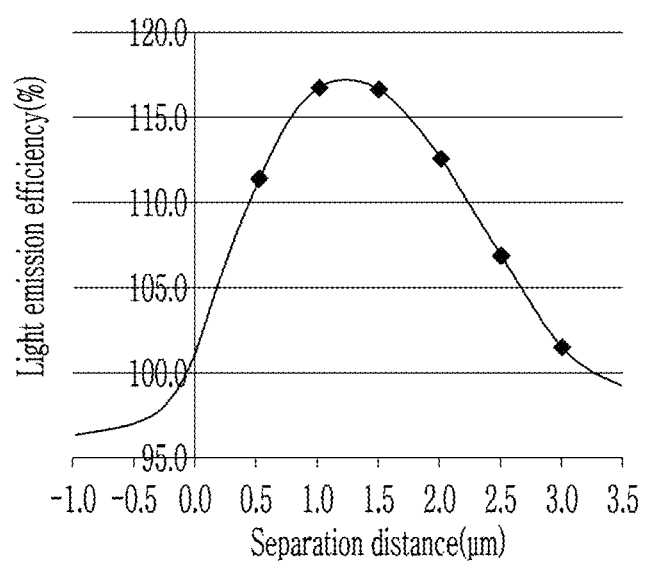
FIG. 7 is a graph that illustrates light emission efficiency with respect to the separation distance between the first opening and the second opening.

Referring back to FIG. 1, the shape of each of the first opening 195 and the second opening 455 in each pixel PX and the separation distance S between the first opening 195 and the second opening 455 will be described. In the description related to the numerical value of the separation distance S, FIG. 7 will be further referenced. FIG. 7 is a graph that illustrates light emission efficiency with respect to the separation distance S between the first opening 195 and the second opening 455.

The red pixel R may include a first red pixel R1 and a second red pixel R2. The first openings 195 located at the first red pixel R1 and the second red pixel R2 may be formed in a substantially square shape. That is, the first side 195a, the second side 195b, the third side 195c, and the fourth side 195d of the first opening 195 located at each of the first red pixel R1 and the second red pixel R2 may be substantially the same in length. The second openings 455 located at the first red pixel R1 and the second red pixel R2 may be formed in a substantially rectangle shape. Two sides facing each other in the second opening 455 may be substantially the same in length. The first side 455a and the third side 455c of the second opening 455 may be substantially the same in length. The second side 455b and the fourth side 455d of the second opening 455 may be substantially the same in length.

The length of the first side 455a and the length of the third side 455c of the second opening 455 located at the first red pixel R1 may be shorter than the length of the second side 455b and the length of the fourth side 455d thereof. Thus, a first separation distance S1 and a third separation distance S3 may be different from a second separation distance S2 and a fourth separation distance S4 at the first red pixel R1. At the first red pixel R1, the first separation distance S1 may be substantially the same as the third separation distance S3, and the second separation distance S2 may be substantially the same as the fourth separation distance S4. At the first red pixel R1, the first separation distance S1 may be larger than the second separation distance S2, and the first separation distance S1 may be larger than the fourth separation distance S4. At the first red pixel R1, the third separation distance S3 may be larger than the second separation distance S2, and the third separation distance S3 may be larger than the fourth separation distance S4.

A length of the first side 455a and a length of the third side 455c of the second opening 455 located at the second red pixel R2 may be longer than a length of the second side 455b and a length of the fourth side 455d thereof. Therefore, at the second red pixel R2, the first separation distance S1 and the third separation distance S3 may be different from the second separation distance S2 and the fourth separation distance S4. At the second red pixel R2, the first separation distance S1 may be substantially the same as the third separation distance S3, and the second separation distance S2 may be substantially the same as the fourth separation distance S4. At the second red pixel R2, the first separation distance S1 may be smaller than the second separation distance S2, and the first separation distance S1 may be smaller than the fourth separation distance S4. At the second red pixel R2, the third separation distance S3 may be smaller than the second separation distance S2, and the third separation distance S3 may be smaller than the fourth separation distance S4.

The second opening 455 located at the first red pixel R1 may be formed in the shape of a rectangle extending in a first direction D1, and the second opening 455 located at the second red pixel R2 may be formed in the shape of a rectangle extending in a second direction D2. In the illustrated embodiment, the second direction D2 is perpendicular to the first direction D1. In FIG. 1, one first red pixel R1 and two second red pixels R2 are illustrated, but the display device 1000 may include a plurality of first red pixels R1 and a plurality of second red pixels R2. In one or more embodiments, the number of first red pixels R1 may be the same as or substantially the same as the number of second red pixels R2.

Referring to FIG. 7, when a separation distance S between the first opening 195 and the second opening 455 has a certain predetermined value, the light emission efficiency becomes the maximum, and the light emission efficiency is reduced when the separation distance is smaller than or larger than the certain predetermined value. In the graph of FIG. 7, it is assumed that the separation distance S between the first opening 195 and the second opening 455 is constant. The horizontal axis indicates the separation distance S between the first opening 195 and the second opening 455, and the vertical axis indicates light emission efficiency. In FIG. 7, 100% light emission efficiency refers to a configuration in which the display device 1000 does not include the high refractive layer 470, and the low refractive layer 450 does not include the second opening 455. That is, the horizontal line in FIG. 7 corresponding to 100% light emission efficiency refers to a configuration of the display device 1000 in which the low refractive layer 450 is not patterned and is formed on the entire substrate 110. When the separation distance S between the first opening 195 and the second opening 455 is about 1.3 µm, the light emission efficiency is the maximum, and when the separation distance between the first opening 195 and the second opening 455 is smaller than or larger than about 1.3 µm, the light emission efficiency is lower than the maximum. The separation distance S between the first opening 195 and the second opening 455 that produces the maximum light emission efficiency can be defined as the preferred separation distance. The preferred separation distance may vary depending on the change of the process design. In addition, the preferred separation distance may be different for each of the red, green, and blue pixels R, G, and B.

At the first red pixel R1, the first separation distance S1 and the third separation distance S3 may be larger than the preferred separation distance. At the first red pixel R1, the second separation distance S2 and the fourth separation distance S4 may be smaller than the preferred separation distance. Further, at the second red pixel R2, the first separation distance S1 and the third separation distance S3 may be smaller than the preferred separation distance. At the second red pixel R2, the second separation distance S2 and the fourth separation distance S4 may be smaller than the preferred separation distance.

For example, at the first red pixel R1, the first separation distance S1 and the third separation distance S3 may be about 1.8 µm, and the second separation distance S2 and the fourth separation distance S4 may be about 0.8 µm. In this embodiment, at the second red pixel R2, the first separation distance S1 and the third separation distance S3 may be about 0.8 µm, and the second separation distance S2 and the fourth separation distance S4 may be about 1.8 µm. However, at the first red pixel R1 and the second red pixel R2, the ranges of the first to fourth separation distances S1, S2, S3, and S4 are not limited to these values, and may be variously changed. Alternatively, at the first red pixel R1, the first separation distance S1 and the third separation distance S3 may be about 2.3 µm, and the second separation distance S2 and the fourth separation distance S4 may be about 0.3 µm. In this embodiment, at the second red pixel R2, the first separation distance S1 and the third separation distance S3 may be about 0.3 µm, and the second separation distance S2 and the fourth separation distance S4 may be about 2.3 µm. Alternatively, at the first red pixel R1, the first separation distance S1 and the third separation distance S3 may be about 1.4 µm, and the second separation distance S2 and the fourth separation distance S4 may be about 1.2 µm. In this embodiment, at the second red pixel R2, the first separation distance S1 and the third separation distance S3 may be about 1.2 µm, and the second separation distance S2 and the fourth separation distance S4 may be about 1.4 µm.

At the first red pixel R1 and the second red pixel R2, the first to fourth separation distances S1, S2, S3, and S4 may each be different than the preferred separation distance (e.g., 1.3 µm) by about 0.1 µm or more and less than about 1.0 µm. That is, at least one of the first to fourth separation distances S1, S2, S3, and S4 may be about 1.4 µm or more and less than about 2.3 µm, and the other separation distances among the first to fourth separation distances S1, S2, S3, and S4 may be about 0.3 µm or more and less than about 1.2 µm. Thus, at the first red pixel R1 and the second red pixel R2, a difference between the first separation distance S1 and the second separation distance S2 may be about 0.2 µm or more and less than about 2.0 µm. At the first red pixel R1 and the second red pixel R2, a difference between the first separation distance S1 and the fourth separation distance S4 may be about 0.2 µm or more and less than about 2.0 µm. At the first red pixel R1 and the second red pixel R2, a difference between the third separation distance S3 and the second separation distance S2 may be about 0.2 µm or more and less than about 2.0 µm. At the first red pixel R1 and the second red pixel R2, a difference between the third separation distance S3 and the fourth separation distance S4 may be about 0.2 µm or more and less than about 2.0 µm.

As described in detail below, in the exemplary embodiment, the separation distances S1-S4 are designed to be different from each other at one pixel PX of the display device 1000 to thereby prevent or at least mitigate against light emission efficiency from being changed even if an error occurs in the process of fabricating the display device 1000. Hereinafter, referring to FIG. 8 to FIG. 11, the principle of compensating for changes in light emission efficiency when an error occurs in the process will now be described.

Figure 8:
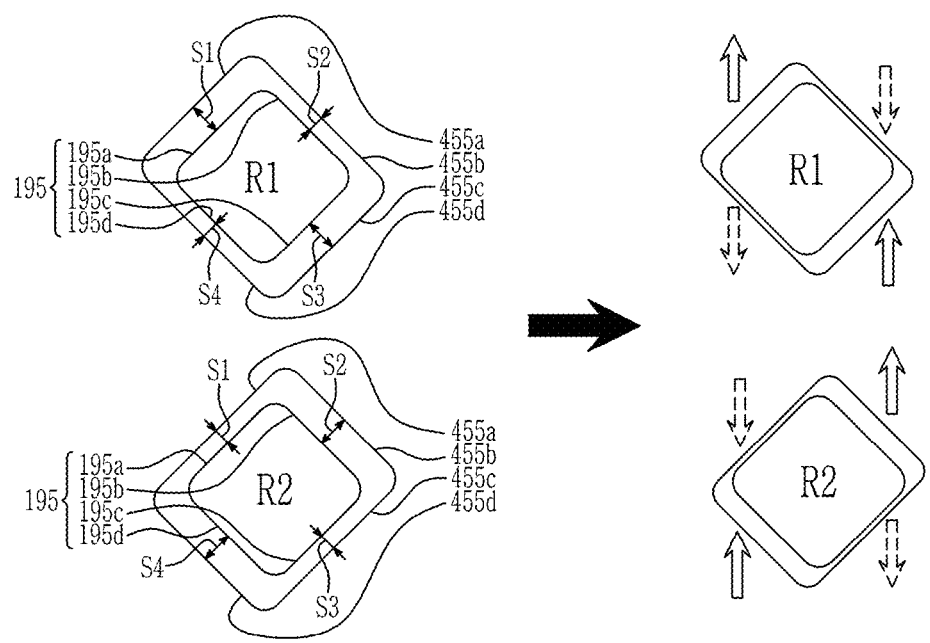
FIG. 8 shows a change in light emission efficiency in the case that some layers are patterned to be smaller than the designed size in the display device according to the exemplary embodiment.
Figure 9:
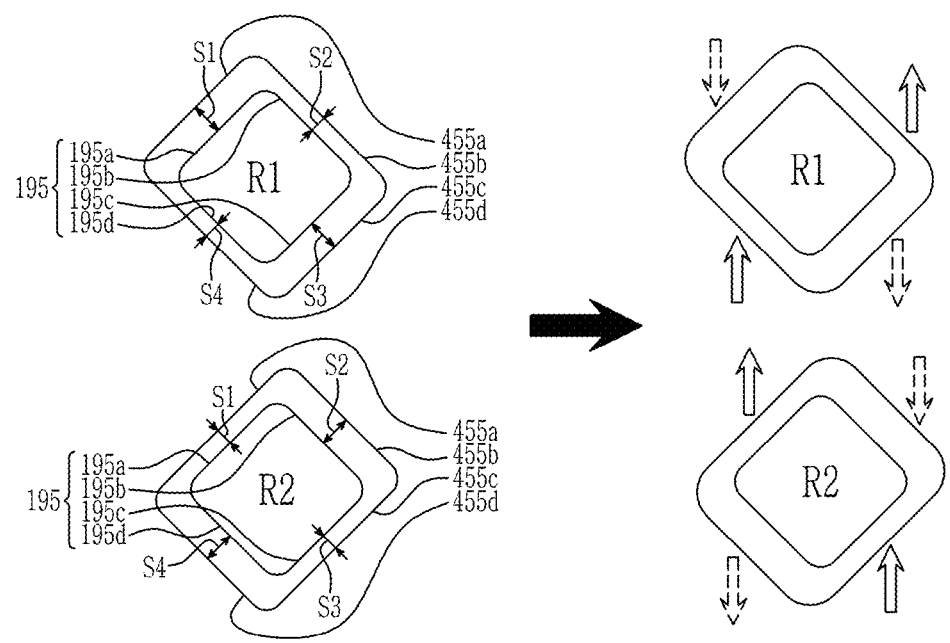
FIG. 9 shows a change in light emission efficiency in the case that some layers are patterned to be larger than the designed size in the display device according to the exemplary embodiment.
Figure 10:
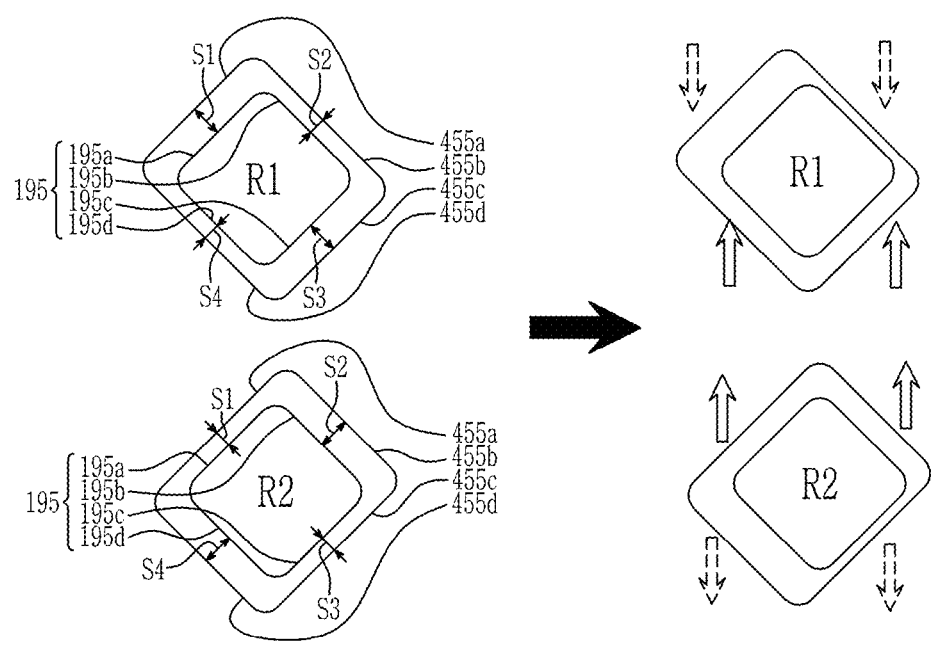
FIG. 10 shows a change in light emission efficiency in the case that some layers of the display device according to the exemplary embodiment are shifted to the left side than designed.
Figure 11:
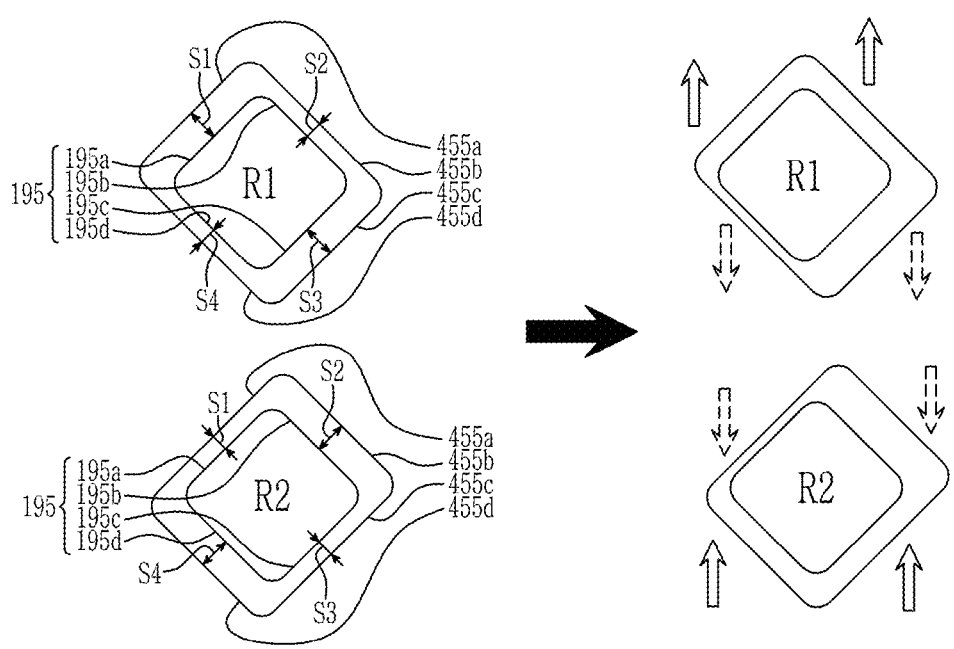
FIG. 11 shows a change in light emission efficiency in the case that some layers of the display device according to the exemplary embodiment are shifted to the right side than designed.

FIG. 8 shows a change in light emission efficiency when some layers are patterned to be smaller than the designed size in the display device 1000 according to the exemplary embodiment. FIG. 9 shows a change in light emission efficiency when some layers are patterned to be larger than the designed size in the display device according to the exemplary embodiment. FIG. 10 shows a change in light emission efficiency when some layers of the display device according to the exemplary embodiment are shifted more to the left side than designed. FIG. 11 shows a change in light emission efficiency in when some layers of the display device according to the exemplary embodiment are shifted more to the right side than designed. In FIGS. 9-11, the arrows shown in solid lines indicate an increase in light emission efficiency, and the arrows shown in dashed lines indicate a decrease in light emission efficiency.

As shown in FIG. 8, in the first red pixel R1 and the second red pixel R2 of the display device according to the exemplary embodiment, the first opening 195 may be patterned as designed, and the second opening 455 may be patterned to be smaller than designed. In this embodiment, at the first red pixel R1 and the second red pixel R2, the first separation distance S1, the second separation distance S2, the third separation distance S3, and the fourth separation distance S4 are reduced.

At the first red pixel R1, the first separation distance S1 is designed to be larger than the preferred separation distance and thus light emission efficiency is increased as the first separation distance S1 is reduced. Since the second separation distance S2 is designed to be smaller than the preferred separation distance at the first red pixel R1, light emission efficiency is reduced as the second separation distance S2 is reduced. The third separation distance S3 is designed to be larger than the preferred separation distance at the first red pixel R1, and thus light emission efficiency is increased as the third separation distance S3 is reduced. The fourth separation distance S4 is designed to be smaller than the preferred separation distance at the first red pixel R1, and thus light emission efficiency is decreased as the fourth separation distance S4 is reduced. In one or more embodiments, the increase in the light emission efficiency as the first separation distance S1 and the third separation distance S3 decrease is substantially equivalent to the decrease in the light emission efficiency as the second separation distance S2 and the fourth separation distance S4 decrease, thereby compensating for changes to the light emission efficiency (e.g., the changes to the light emission efficiency cancel each other out). That is, even if an error occurs in the process of fabricating the display device 1000 (e.g., an error occurs in fabricating the second opening 455 at the first red pixel R1), it is possible to prevent light emission efficiency from being changed. Accordingly, designing the first and third separation distances S1, S3 to be larger than the preferred separation distance and designing the second and fourth separation distances S2, S4 to be smaller than the preferred separation distance is configured to maintain a constant or substantially constant light emission efficiency of the display device 1000 if the size of the second opening 455 at the first red pixel R1 is fabricated smaller than designed.

At the second red pixel R2, the first separation distance S1 is designed to be smaller than the preferred separation distance, and thus the light emission efficiency is decreased as the first separation distance S1 is reduced. The second separation distance S2 is designed to be larger than the preferred separation distance at the second red pixel R2 and thus the light emission efficiency is increased as the second separation distance S2 is reduced. The third separation distance S3 is designed to be smaller than the preferred separation distance at the second red pixel R2 and thus light emission efficiency is decreased as the third separation distance S3 is reduced. The fourth separation distance S4 is designed to be larger than the preferred separation distance at the second red pixel R2 and thus light emission efficiency is increased as the fourth separation distance S4 is reduced. In one or more embodiments, the decrease in the light emission efficiency as the first separation distance S1 and the third separation distance S3 decrease is substantially equivalent to the increase in the light emission efficiency as the second separation distance S2 and the fourth separation distance S4 decrease, thereby compensating for changes to the light emission efficiency (e.g., the changes to the light emission efficiency cancel each other out). That is, even if an error occurs in the process of fabricating the display device 1000 (e.g., an error occurs in fabricating the second opening 455 at the second red pixel R2), it is possible to prevent light emission efficiency from being changed. Accordingly, designing the first and third separation distances S1, S3 to be larger than the preferred separation distance and designing the second and fourth separation distances S2, S4 to be smaller than the preferred separation distance is configured to maintain a constant or substantially constant light emission efficiency of the display device 1000 if the size of the second opening 455 at the second red pixel R2 is fabricated smaller than designed.

As shown in FIG. 9, at the first red pixel R1 and the second red pixel R2 of the display device according to the exemplary embodiment, the first openings 195 may be patterned as designed and the second openings 455 may be patterned to be larger than designed. In this embodiment, the first separation distance S1, the second separation distance S2, the third separation distance S3, and the fourth separation distance S4 in the first red pixel R1 and the second red pixel R2 are increased.

Since the first separation distance S1 is designed to be larger than the preferred separation distance at the first red pixel R1, light emission efficiency is decreased as the first separation distance S1 is increased. Since the second separation distance S2 is designed to be smaller than preferred separation distance at the first red pixel R1, light emission efficiency is increased as the second separation distance S2 is increased. The third separation distance S3 is designed to be larger than the preferred separation distance at the first red pixel R1 and thus light emission efficiency is decreased as the third separation distance S3 is increased. The fourth separation distance S4 is designed to be smaller than the preferred separation distance in the first red pixel R1 and thus light emission efficiency is increased as the fourth separation distance S4 is increased. In one or more embodiments, the decrease in the light emission efficiency according to the increase of the first separation distance S1 and the third separation distance S3 is substantially equivalent to the increase in the light emission efficiency according to the increase of the second separation distance S2 and the fourth separation distance S4, thereby compensating for changes to the light emission efficiency (e.g., the changes to the light emission efficiency cancel each other out). That is, even if an error occurs in the process of fabricating the display device 1000 (e.g., an error occurs in fabricating the second opening 455 at the first red pixel R1), it is possible to prevent light emission efficiency from being changed. Accordingly, designing the first and third separation distances S1, S3 to be larger than the preferred separation distance and designing the second and fourth separation distances S2, S4 to be smaller than the preferred separation distance is configured to maintain a constant or substantially constant light emission efficiency of the display device 1000 if the size of the second opening 455 at the first red pixel R1 is fabricated larger than designed.

At the second red pixel R2, the first separation distance S1 is designed to be smaller than the preferred separation distance and thus light emission efficiency is increased as the first separation distance S1 is increased. The second separation distance S2 is designed to be larger than the preferred separation distance at the second red pixel R2 and thus light emission efficiency is decreased as the second separation distance S2 is increased. The third separation distance S3 is designed to be smaller than the preferred separation distance at the second red pixel R2 and thus light emission efficiency is increased as the third separation distance S3 is increased. The fourth separation distance S4 is designed to be larger than the preferred separation distance at the second red pixel R2 and thus light emission efficiency is decreased as the fourth separation distance S4 is increased. In one or more embodiments, the increase in the light emission efficiency according to the increase of the first separation distance S1 and the third separation distance S3 is substantially equivalent to the decrease in the light emission efficiency according to the increase of the second separation distance S2 and the fourth separation distance S4, thereby compensating for changes to the light emission efficiency (e.g., the changes to the light emission efficiency cancel each other out). That is, even if an error occurs in the process of fabricating the display device 1000 (e.g., an error occurs in fabricating the second opening 455 at the second red pixel R2), it is possible to prevent light emission efficiency from being changed. Accordingly, designing the first and third separation distances S1, S3 to be larger than the preferred separation distance and designing the second and fourth separation distances S2, S4 to be smaller than the preferred separation distance is configured to maintain a constant or substantially constant light emission efficiency of the display device 1000 if the size of the second opening 455 at the second red pixel R2 is fabricated larger than designed.

As shown in FIG. 10, the first opening 195 at the first red pixel R1 and the second red pixel R2 of the display device 1000 according to the exemplary embodiment may be patterned as designed, and the second opening 455 at the first red pixel R1 and the second red pixel R2 may be patterned to be shifted more to the left side than designed.

In this embodiment, the first separation distance S1 and the fourth separation distance S4 are increased and the second separation distance S2 and the third separation distance S3 are decreased at the first red pixel R1 and the second red pixel R2.

The first separation distance S1 in the first red pixel R1 is designed to be larger than the preferred separation distance and thus light emission efficiency is decreased as the first separation distance S1 is increased. The second separation distance S2 at the first red pixel R1 is designed to be smaller than the preferred separation distance and thus light emission efficiency is decreased as the second separation distance S2 is decreased. The third separation distance S3 at the first red pixel R1 is designed to be larger than the preferred separation distance and thus light emission efficiency is increased as the third separation distance S3 is decreased. The fourth separation distance S4 at the first red pixel R1 is designed to be smaller than the preferred separation distance and this light emission efficiency is increased as the fourth separation distance S4 is increased. In one or more embodiments, the decrease in the light emission efficiency according to the changes in the first separation distance S1 and the second separation distance S2 is substantially equivalent to the increase in the light emission efficiency according to the changes in the third separation distance S3 and the fourth separation distance S4, thereby compensating for changes to the light emission efficiency (e.g., the changes to the light emission efficiency cancel each other out). That is, even if an error occurs in the process of fabricating the display device 1000 (e.g., an error occurs in fabricating the second opening 455 at the first red pixel R1), it is possible to prevent light emission efficiency from being changed. Accordingly, designing the first and third separation distances S1, S3 to be larger than the preferred separation distance and designing the second and fourth separation distances S2, S4 to be smaller than the preferred separation distance is configured to maintain a constant or substantially constant light emission efficiency of the display device 1000 if the position of the second opening 455 at the first red pixel R1 is shifted to the left more than designed.

At the second red pixel R2, the first separation distance S1 is designed to be smaller than the preferred separation distance and thus light emission efficiency is increased as the first separation distance S1 is increased. The second separation distance S2 at the second red pixel R2 is designed to be larger than the preferred separation distance and thus light emission efficiency is increased as the second separation distance is decreased. The third separation distance S3 at the second red pixel R2 is designed to be smaller than the preferred separation distance and thus light emission efficiency is decreased as the third separation distance S3 is decreased. The fourth separation distance S4 at the second red pixel R2 is designed to be larger than the preferred separation distance and thus light emission efficiency is decreased as the fourth separation distance S4 is increased. In one or more embodiments, the increase in the light emission efficiency according to the changes in the first separation distance S1 and the second separation distance S2 is substantially equivalent to the decrease in the light emission efficiency according to the changes in the third separation distance S3 and the fourth separation distance S4, thereby compensating for changes to the light emission efficiency (e.g., the changes to the light emission efficiency cancel each other out). That is, even if an error occurs in the process of fabricating the display device 1000 (e.g., an error occurs in fabricating the second opening 455 at the second red pixel R2), it is possible to prevent light emission efficiency from being changed. Accordingly, designing the first and third separation distances S1, S3 to be larger than the preferred separation distance and designing the second and fourth separation distances S2, S4 to be smaller than the preferred separation distance is configured to maintain a constant or substantially constant light emission efficiency of the display device 1000 if the position of the second opening 455 at the second red pixel R2 is shifted to the left more than designed.

As shown in FIG. 11, the first opening 195 at the first red pixel R1 and the second red pixel R2 of the display device according to the exemplary embodiment may be patterned as designed, and the second opening 455 may be patterned to be shifted more to the right side than designed. In this embodiment, the first separation distance S1 and the fourth separation distance S4 are decreased and the second separation distance S2 and the third separation distance S3 are increased in the first red pixel R1 and the second red pixel R2.

At the first red pixel R1, the first separation distance S1 is designed to be larger than the preferred separation distance and thus light emission efficiency is decreased as the first separation distance S1 is decreased. The second separation distance S2 at the first red pixel R1 is designed to be smaller than the preferred separation distance and thus light emission efficiency is increased as the second separation distance S2 is increased. The third separation distance S3 at the first red pixel R1 is designed to be larger than the preferred separation distance and thus light emission efficiency is decreased as the third separation distance S3 is increased. The fourth separation distance S4 at the first red pixel R1 is designed to be smaller than the preferred separation distance and this light emission efficiency is decreased as the fourth separation distance S4 is decreased. In one or more embodiments, the increase in the light emission efficiency according to the changes in the first separation distance S1 and the second separation distance S2 is substantially equivalent to the decrease in the light emission efficiency according to the changes in the third separation distance S3 and the fourth separation distance S4, thereby compensating for changes to the light emission efficiency (e.g., the changes to the light emission efficiency cancel each other out). That is, even if an error occurs in the process of fabricating the display device 1000 (e.g., an error occurs in fabricating the second opening 455 at the first red pixel R1), it is possible to prevent light emission efficiency from being changed. Accordingly, designing the first and third separation distances S1, S3 to be larger than the preferred separation distance and designing the second and fourth separation distances S2, S4 to be smaller than the preferred separation distance is configured to maintain a constant or substantially constant light emission efficiency of the display device 1000 if the position of the second opening 455 at the first red pixel R1 is shifted to the right more than designed.

At the second red pixel R2, the first separation distance S1 is designed to be smaller than the preferred separation distance and thus light emission efficiency is decreased as the first separation distance S1 is decreased. The second separation distance S2 at the second red pixel R2 is designed to be larger than the preferred separation distance and thus light emission efficiency is decreased as the second separation distance is increased. The third separation distance S3 at the second red pixel R2 is designed to be smaller than the preferred separation distance and thus light emission efficiency is increased as the third separation distance S3 is increased. The fourth separation distance S4 at the second red pixel R2 is designed to be larger than the preferred separation distance and thus light emission efficiency is increased as the fourth separation distance S4 is decreased. In one or more embodiments, the decrease in the light emission efficiency according to the changes in the first separation distance S1 and the second separation distance S2 is substantially equivalent to the increase in the light emission efficiency according to the changes in the third separation distance S3 and the fourth separation distance S4, thereby compensating for changes to the light emission efficiency (e.g., the changes to the light emission efficiency cancel each other out). That is, even if an error occurs in the process of fabricating the display device 1000 (e.g., an error occurs in fabricating the second opening 455 at the first red pixel R1), it is possible to prevent light emission efficiency from being changed. Accordingly, designing the first and third separation distances S1, S3 to be larger than the preferred separation distance and designing the second and fourth separation distances S2, S4 to be smaller than the preferred separation distance is configured to maintain a constant or substantially constant light emission efficiency of the display device 1000 if the position of the second opening 455 at the second red pixel R2 is shifted to the right more than designed.

Referring back to FIG. 1, the blue pixel B may include a first blue pixel B1 and a second blue pixel B2. The first openings 195 at the first blue pixel B1 and the second blue pixel B2 may be formed in a substantially square shape. That is, the first side 195a, the second side 195b, the third side 195c, and the fourth side 195d of the first opening 195 at each of the first blue pixel B1 and the second blue pixel B2 may be substantially the same in length. The size of the first opening 195 at the blue pixel B may be larger than the size of the first opening 195 at the red pixel R. Since luminance of the blue light emitting element is relatively lower than luminance of the red light emitting element, the lower luminance can be compensated by increasing the size of the first opening 195 at the blue pixel B relative to the size of the first opening 195 at the red pixel R. However, this is only an example, and the size(s) of the first opening 195 at the blue pixel B and the red pixel R can be variously changed. For example, the size of the first opening 195 at the blue pixel B may be substantially the same as or smaller than the size of the first opening 195 at the red pixel R.

The second openings 455 at the first blue pixel B1 and the second blue pixel B2 may be formed in a substantially rectangle shape. Two sides facing each other in the second opening 455 may be substantially the same in length. The first side 455a and the third side 455c of the second opening 455 may be substantially the same in length. The second side 455b and the fourth side 455d of the second opening 455 may be substantially the same in length. The size of the second opening 455 at the blue pixel B may be larger than the size of the second opening 455 at the red pixel R. However, the exemplary embodiment is not limited thereto, and the size(s) of the second opening 455 at the blue pixel B and the red pixel R may be variously changed.

The second opening 455 at the first blue pixel B1 and the second opening 455 at the first red pixel R1 may be different from each other in size, while being similar to each other in shape. The second opening 455 at the second blue pixel B2 and the second opening 455 at the second red pixel R2 may be different from each other in size, while being similar to each other in shape. However, this is just an example, and the second opening 455 at the first blue pixel B1 and the second opening 455 at the first red pixel R1 may be equivalent to each other in size, while being different from each other in shape. Alternatively, the second opening 455 at the second blue pixel B2 and the second opening 455 at the second red pixel R2 may be equivalent to each other in size, while having different shapes.

The first separation distance S1, the second separation distance S2, the third separation distance S3, and the fourth separation distance S4 at the first blue pixel B1 may be substantially equivalent to the first separation distance S1, the second separation distance S2, the third separation distance S3, and the fourth separation distance S4, respectively, at the first red pixel R1. In addition, the first separation distance S1, the second separation distance S2, the third separation distance S3, and the fourth separation distance S4 at the second blue pixel B2 may be substantially equivalent to the first separation distance S1, the second separation distance S2, the third separation distance S3, and the fourth separation distance S4, respectively, at the second red pixel R2.

As previously described, the preferred separation distance in each of the red, green, and blue pixels R, G, and B may be different from one another. Accordingly, the first separation distance S1, the second separation distance S2, the third separation distance S3, and the fourth separation distance S4 at the first blue pixel B1 may be different from the first separation distance S1, the second separation distance S2, the third separation distance S3, and the fourth separation distance S4, respectively, at the first red pixel R1. In addition, the first separation distance S1, the second separation distance S2, the third separation distance S3, and the fourth separation distance S4 at the second blue pixel B2 may be different from the first separation distance S1, the second separation distance S2, the third separation distance S3, and the fourth separation distance S4, respectively, at the second red pixel R2.

The second opening 455 at the first blue pixel B1 may be formed in the shape of a rectangle extending in the first direction D1, and the second opening 455 at the second blue pixel B2 may be formed in the shape of a rectangle extending in the second direction D2. In FIG. 1, one first blue pixel B1 and one second blue pixel B2 are illustrated, but the display device 1000 may include a plurality of first blue pixels B1 and a plurality of second blue pixels B2. In this embodiment, the number of first blue pixels B1 and the number of second blue pixels B2 may be substantially equivalent to each other.

At the first blue pixel B1, the first separation distance S1 and the third separation distance S3 may be larger than the preferred separation distance. At the first blue pixel B1, the second separation distance S2, and the fourth separation distance S4 may be smaller than the preferred separation distance. In addition, at the second blue pixel B2, the first separation distance S1, and the third separation distance S3 may be smaller than the preferred separation distance. At the second blue pixel B2, the second separation distance S2 and the fourth separation distance S4 may be larger than the preferred separation distance.

At the first blue pixel B1 and the second blue pixel B2, a difference between each of the first to fourth separation distances S1, S2, S3, and S4 and the preferred separation distance (e.g., 1.3 μm) may be about 0.1 μm or more and less than about 1.0 μm. That is, at least one of the first to fourth separation distances S1, S2, S3, and S4 may be about 1.4 μm or more and less than about 2.3 μm, and the other separation distances of the first to fourth separation distances S1, S2, S3, and S4 may be about 0.3 μm or more and less than about 1.2 μm. Thus, at the first blue pixel B1 and the second blue pixel B2, a difference between the first separation distance S1 and the second separation distance S2 may be about 0.2 μm or more and less than about 2.0 μm. At the first blue pixel B1 and the second blue pixel B2, a difference between the first separation distance S1 and the fourth separation distance S4 may be about 0.2 μm or more and less than about 2.0 μm. At the first blue pixel B1 and the second blue pixel B2, a difference between the third separation distance S3 and the second separation distance S2 may be about 0.2 μm or more and less than about 2.0 μm. At the first blue pixel B1 and the second blue pixel B2, a difference between the third separation distance S3 and the fourth separation distance S4 may be about 0.2 μm or more and less than about 2.0 μm.

Thus, by designing the separation distances S1-S4 differently within one pixel PX, even if a process error occurs in fabricating the display device 1000, the change in light emission efficiency can be prevented or at least mitigated against. The principle by which the change in light emission efficiency in the blue pixel B is compensated is substantially equivalent to that of the red pixel R described above.

In the display device 1000 according to the exemplary embodiment, it has been described that the first opening 195 at the red pixel R and the blue pixel B is formed in the shape of a square, the first separation distance S1 and the third separation distance S3 are equivalent to each other, the second separation distance S2 and the fourth separation distance S4 are equivalent to each other, and the first separation distance S1 and the second separation distance S2 are different from each other at the red pixel R and the blue pixel B. The design of the red pixel R and the blue pixel B are not limited thereto, and the first separation distance S1 and the second separation distance S2 may be equivalent to each other, the third separation distance S3 and the fourth separation distance S4 may be equivalent to each other, and the first separation distance S1 and the third separation distance S3 may be different from each other. In this embodiment, variations in light emission efficiency may occur when an error occurs in the process of fabricating the display device 1000. For example, fluctuations in light emission efficiency may occur when shifting up and shifting down occur. However, the fluctuations in light emission efficiency can be prevented when the shifting occurs to the left or to the right.

The green pixel G may include a first green pixel G1, a second green pixel G2, a third green pixel G3, and a fourth green pixel G4. The first openings 195 at the first green pixel G1, the second green pixel G2, the third green pixel G3, and the fourth green pixel G4 may be formed in the shape of an approximate rectangle. That is, at the first green pixel G1, the second green pixel G2, the third green pixel G3, and the fourth green pixel G4, two sides of the first opening 195 facing each other may be substantially equivalent to each other in length. The first side 195a and the third side 195c of the first opening 195 may be substantially equivalent to each other in length. The second side 195b and the fourth side 195d of the first opening 195 may be substantially equivalent to each other in length. In the first opening 195 at the first green pixel G1 and the fourth green pixel G4, the first side 195a and the third side 195c may be longer than the second side 195b and the fourth side 195d. In the first opening 195 at the second green pixel G2 and the third green pixel G3, the first side 195a and the third side 195c may be shorter than the second side 195b and the fourth side 195d.

As previously described, the size of the first opening 195 at the blue pixel B may be relatively larger in size than the first opening 195 at the red pixel R. In this embodiment, the green pixel G may be formed in the shape of a rectangle to make the spacing between the first openings 195 of each pixel PX constant. That is, a side of the green pixel G adjacent to the blue pixel B may be relatively long, and a side of the green pixel G adjacent to the red pixel R may be relatively short.

The second openings 455 at the first green pixel G1, the second green pixel G2, the third green pixel G3, and the fourth green pixel G4 may be formed in the shape of a rectangle. In the second opening 455 at the first green pixel G1, the second green pixel G2, the third green pixel G3, and the fourth green pixel G4, two sides facing each other may be substantially equivalent to each other in length. In the second opening 455, the first side 455a and the third side 455c may be substantially equivalent to each other in length. In the second opening 455, the second side 455b and the fourth side 455d may be substantially equivalent to each other in length. In the second opening 455 at the first green pixel G1 and the fourth green pixel G4, the first side 455a and the third side 455c may be longer than the second side 455b and the fourth side 455d in length. In the second opening 455 at the second green pixel G2 and third green pixel G3, the first side 455*a* and the third side 455*c* may be shorter in length than the second side 455*b* and the fourth side 455*d*.

At the first green pixel G1 and the third green pixel G3, the first separation distance S1 and the second separation distance S2 may be different than the third separation distance S3 and the fourth separation distance S4. At the first green pixel G1 and the third green pixel G3, the first separation distance S1 may be substantially equivalent to the second separation distance S2, and the third separation distance S3 may be substantially equivalent to the fourth separation distance S4. At the first green pixel G1 and the third green pixel G3, the first separation distance S1 may be smaller than the third separation distance S3, and the first separation distance S1 may be smaller than the fourth separation distance S4. At the first green pixel G1 and the third green pixel G3, the second separation distance S2 may be smaller than the third separation distance S3, and the second separation distance S2 may be smaller than the fourth separation distance S4.

At the second green pixel G2 and the fourth green pixel G4, the first separation distance S1 and the second separation distance S2 may be different than the third separation distance S3 and the fourth separation distance S4. At the second green pixel G2 and the fourth green pixel G4, the first separation distance S1 may be substantially equivalent to the second separation distance S2, and the third separation distance S3 may be substantially equivalent to the fourth separation distance S4. At the second green pixel G2 and the fourth green pixel G4, the first separation distance S1 may be larger than the third separation distance S3 and the first separation distance S1 may be larger than the fourth separation distance S4. At the second green pixel G2 and the fourth green pixel G4, the second separation distance S2 may be larger than the third separation distance S3 and the second separation distance S2 may be larger than the fourth separation distance S4.

At the first green pixel G1 and the third green pixel G3, the first separation distance S1 and the second separation distance S2 may be substantially equivalent to the second separation distance S2 and the fourth separation distance S4 in the first red pixel R1. In addition, the third separation distance S3 and the fourth separation distance S4 at the first green pixel G1 and the third green pixel G3 may be substantially equivalent to the first separation distance S1 and the third separation distance S3 at the first red pixel R1. In addition, the first separation distance S1 and the second separation distance S2 at the second green pixel G2 and the fourth green pixel G4 may be substantially equivalent to the first separation distance S1 and the third separation distance S3 at the first red pixel R1. In addition, the third separation distance S3 and the fourth separation distance S4 at the second green pixel G2 and the fourth green pixel G4 may be substantially equivalent to the second separation distance S2 and the fourth separation distance S4 at the first red pixel R1.

As previously described, the preferred separation distances in the red, the green, and the blue pixels R, G, and B may be different from each other. Accordingly, the first separation distance S1 and the second separation distance S2 at the first green pixel G1 and the third green pixel G3 may be different from the second separation distance S2 and the fourth separation distance S4 at the first red pixel R1. In addition, the third separation distance S3 and the fourth separation distance S4 at the first green pixel G1 and the third green pixel G3 may be different from the first separation distance S1 and the third separation distance S3 at the first red pixel R1. In addition, the first separation distance S1 and the second separation distance S2 at the second green pixel G2 and the fourth green pixel G4 may be different from the first separation distance S1 and the third separation distance S3 at the first red pixel R1. In addition, the third separation distance S3 and the fourth separation distance S4 at the second green pixel G2 and the fourth green pixel G4 may be different from the second separation distance S2 and the fourth separation distance S4 at the first red pixel R1.

The first opening 195 and the second opening 455 at the first green pixel G1 and the fourth green pixel G4 may be formed in the shape of a rectangle extending in the second direction D2. The first opening 195 and the second opening 455 at the second green pixel G2 and the third green pixel G3 may be formed in the shape of a rectangle extending in the first direction D1. The first openings 195 at the first green pixel G1 and the third green pixel G3 are relatively closer to the first side 455*a* and the second side 455*b* of the second opening 455. The first openings 195 at the second green pixel G2 and the fourth green pixel G4 are relatively closer to the third side 455*c* and the fourth side 455*d* of the second opening 455. In FIG. 1, one first green pixel G1, one second green pixel G2, one third green pixel G3, and one fourth green pixel G4 are illustrated, but the display device 1000 may include a plurality of first green pixels G1, a plurality of second green pixels G2, a plurality of third green pixels G3, and a plurality of fourth green pixels G4. In this embodiment, the number of first green pixels G1, the number of second green pixels G2, the number of third green pixels G3, and the number of fourth green pixels G4 may be substantially equivalent to each other.

At the first green pixel G1 and the third green pixel G3, the first separation distance S1 and the second separation distance S2 may be smaller than the preferred separation distance. At the first green pixel G1 and the third green pixel G3, the third separation distance S3 and the fourth separation distance S4 may be larger than the preferred separation distance. At the second green pixel G2 and the fourth green pixel G4, the first separation distance S1 and the second separation distance S2 may be larger than the preferred separation distance. At the second green pixel G2 and the fourth green pixel G4, the third separation distance S3 and the fourth separation distance S4 may be smaller than the preferred separation distance.

At the first green pixel G1, the second green pixel G2, the third green pixel G3, and the fourth green pixel G4, the first to fourth separation distances S1, S2, S3, and S4 may each be different than the preferred separation distance (e.g., 1.3 μm) by about 0.1 μm or more and less than about 1.0 μm. That is, one of the first to fourth separation distances S1, S2, S3, and S4 may be about 1.4 μm or more and less than about 2.3 μm, and the other separation distances of the first to fourth separation distances S1, S2, S3, and S4 may be about 0.3 μm or more and less than about 1.2 μm. Thus, at the first green pixel G1, the second green pixel G2, the third green pixel G3, and the fourth green pixel G4, a difference between the first separation distance S1 and the third separation distance S3 may be about 0.2 μm or more and less than about 2.0 μm. At the first green pixel G1, the second green pixel G2, the third green pixel G3, and the fourth green pixel G4, a difference between the first separation distance S1 and the fourth separation distance S4 may be about 0.2 μm or more and less than about 2.0 μm. At the first green pixel G1, the second green pixel G2, the third green pixel G3, and the fourth green pixel G4, a difference between the second separation distance S2 and the third separation distance S3 may be about 0.2 μm or more and less than about 2.0 μm. At the first green pixel G1, the second green pixel G2, the third green pixel G3, and the fourth green pixel G4, a difference between the second separation distance S2 and the fourth separation distance S4 may be about 0.2 μm or more and less than about 2.0 μm.

As described in more detail below, in the display device 1000 according to the exemplary embodiment, a separation distance S within one pixel PX is designed to be different, thereby preventing the change in light emission efficiency even when an error occurs in the process of fabricating the display device 1000. Hereinafter, referring to FIG. 12 to FIG. 15, the principle of compensating for changes in light emission efficiency when an error occurs in the process of fabricating the display device 1000 will be described.

Figure 12:
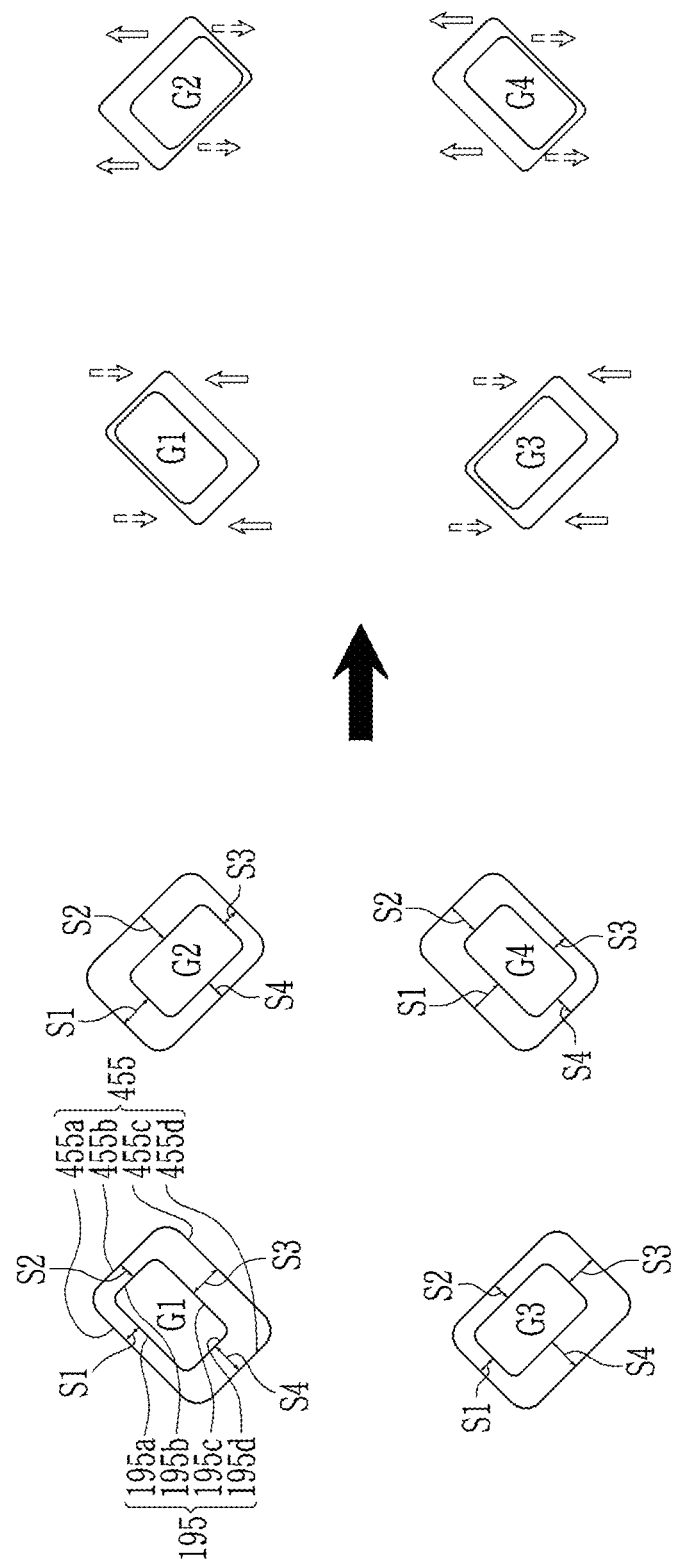
FIG. 12 shows a change in light emission efficiency when some layers are patterned to be smaller than designed in a display device according to an exemplary embodiment.
Figure 13:
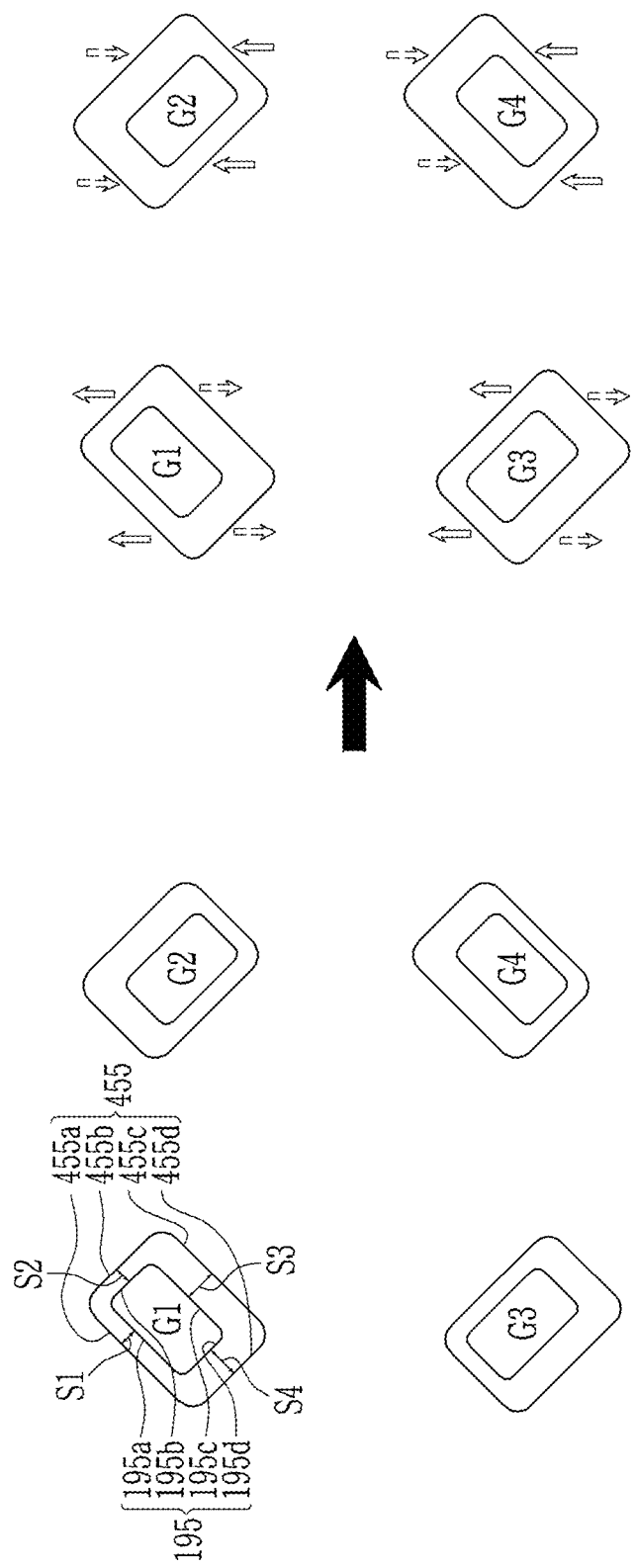
FIG. 13 shows a change in light emission efficiency when some layers are patterned to be larger than designed in a display device according to an exemplary embodiment.
Figure 14:
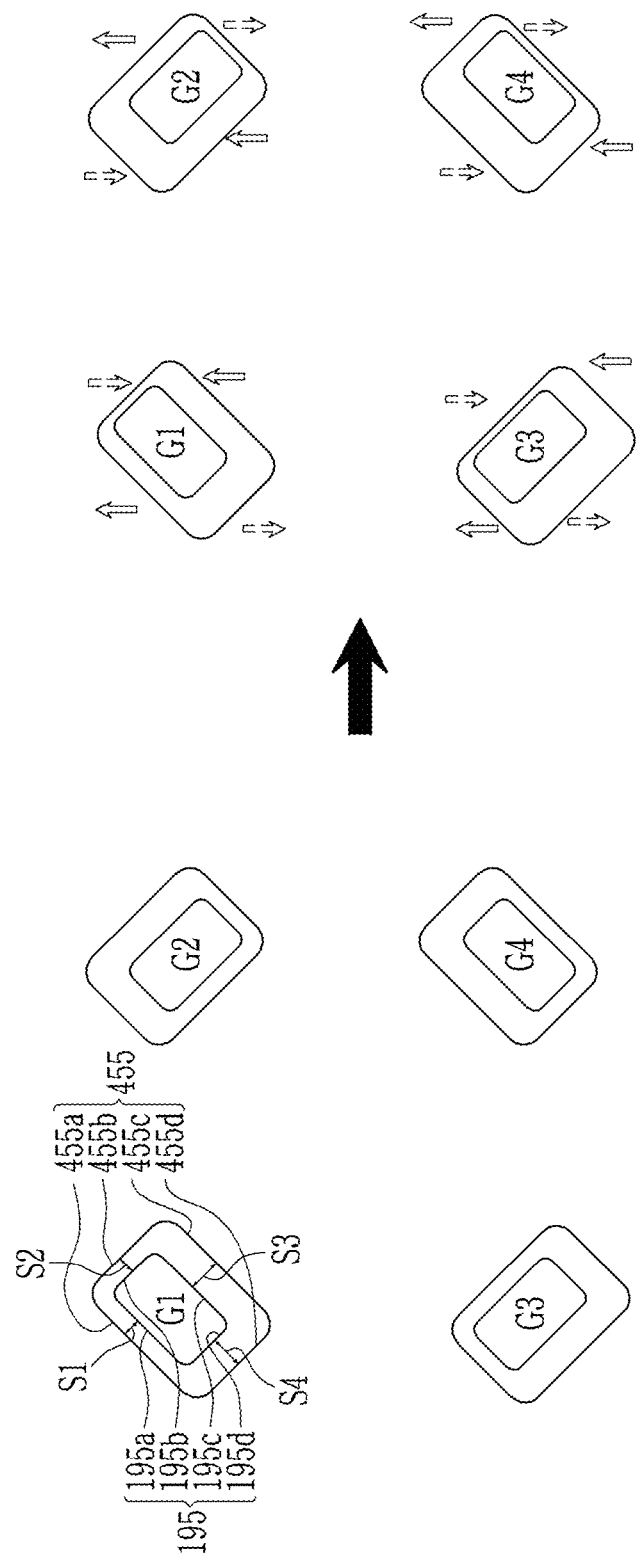
FIG. 14 shows a change in light emission efficiency when some layers are shifted to the left than designed in a display device according to an exemplary embodiment.
Figure 15:
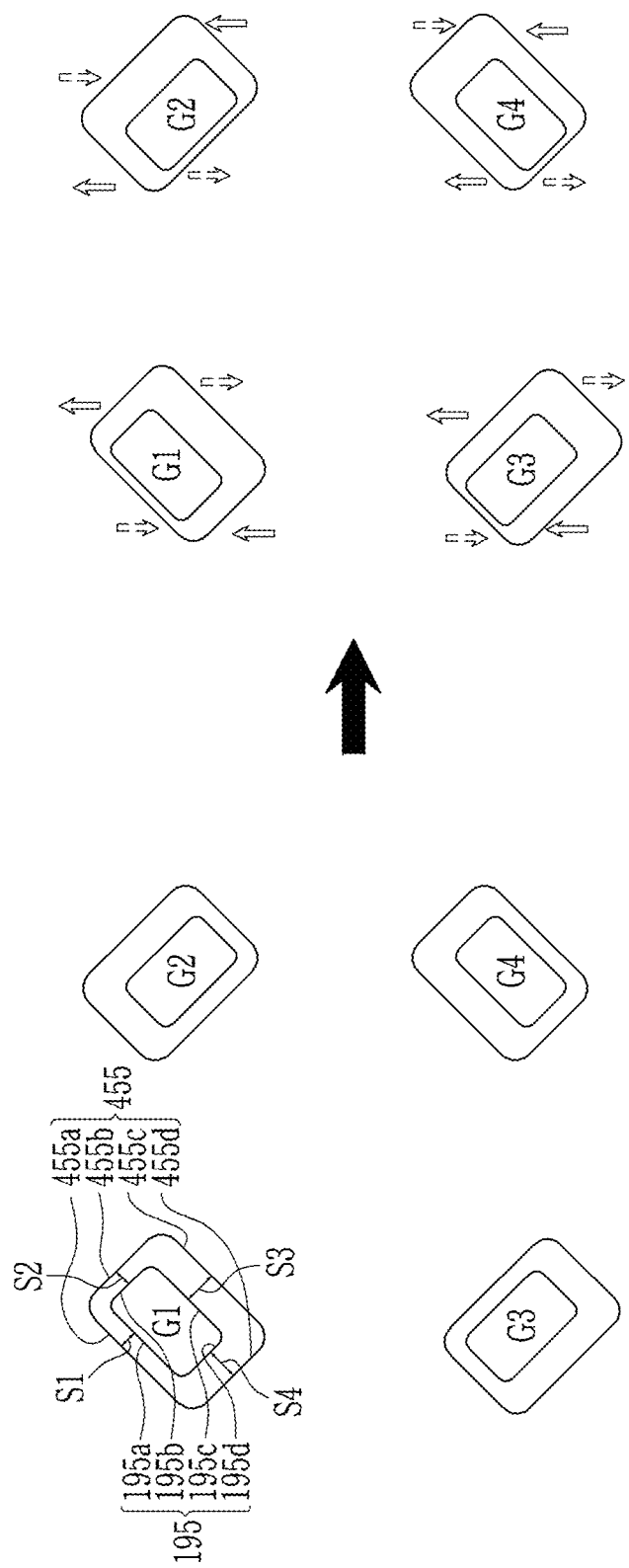
FIG. 15 shows a change in light emission efficiency when some layers are shifted to the right than designed in a display device according to an exemplary embodiment.

FIG. 12 shows a change in light emission efficiency when some layers are patterned to be smaller than designed in a display device according to an exemplary embodiment. FIG. 13 shows a change in light emission efficiency when some layers are patterned to be larger than designed in a display device according to an exemplary embodiment. FIG. 14 shows a change in light emission efficiency when some layers are shifted more to the left than designed in a display device according to an exemplary embodiment. FIG. 15 shows a change in light emission efficiency when some layers are shifted more to the right than designed in a display device according to an exemplary embodiment. In FIGS. 12-15, the arrows shown in solid lines indicate an increase in light emission efficiency, and the arrows shown in dashed lines indicate a decrease in light emission efficiency.

As shown in FIG. 12, at the first green pixel G1, the second green pixel G2, the third green pixel G3, and the fourth green pixel G4 of the display device 1000 according to the exemplary embodiment, the first openings 195 may be patterned as designed and the second openings 455 may be patterned to be smaller than designed. In this embodiment, the first separation distances S1, the second separation distances S2, the third separation distances S3, and the fourth separation distances S4 are decreased in the first green pixel G1, the second green pixel G2, the third green pixel G3, and the fourth green pixel G4.

The first separation distance S1 is designed to be smaller than the preferred separation distance at the first green pixel G1 and the third green pixel G3 and thus light emission efficiency is decreased as the first separation distance S1 is decreased. The second separation distance S2 is designed to be smaller than the preferred separation distance at the first green pixel G1 and the third green pixel G3 and thus light emission efficiency is decreased as the second separation distance S2 is decreased. The third separation distance S3 is designed to be larger than the preferred separation distance at the first green pixel G1 and the third green pixel G3 and thus light emission efficiency is increased as the third separation distance S3 is decreased. The fourth separation distance S4 is designed to be larger than the preferred separation distance at the first green pixel G1 and the third green pixel G3 and thus light emission efficiency is increased as the fourth separation distance S4 is decreased. In one or more embodiments, the decrease in the light emission efficiency according to the decreases in the first separation distance S1 and the second separation distance S2 is substantially equivalent to the increase in the light emission efficiency according to the decreases in the third separation distance S3 and the fourth separation distance S4, thereby compensating for changes in the light emission efficiency (e.g., the changes to the light emission efficiency cancel each other out). That is, even if an error occurs in the process of fabricating the display device 1000 (e.g., an error occurs in fabricating the second opening 455 at the first green pixel G1 and the third green pixel G3), it is possible to prevent light emission efficiency from being changed. Accordingly, designing the first and second separation distances S1, S2 at the first green pixel G1 and the third green pixel G3 to be smaller than the preferred separation distance and designing the third and fourth separation distances S3, S4 at the first green pixel G1 and the third green pixel G3 to be larger than the preferred separation distance is configured to maintain a constant or substantially constant light emission efficiency of the display device 1000 if the size of the second opening 455 at the first green pixel G1 and at the third green pixel G3 are smaller than designed.

The first separation distance S1 is designed to be larger than the preferred separation distance at the second green pixel G2 and the fourth green pixel G4 and thus light emission efficiency is increased as the first separation distance S1 is decreased. The second separation distance S2 is designed to be larger than the preferred separation distance at the second green pixel G2 and the fourth green pixel G4 and thus light emission efficiency is increased as the second separation distance S2 is decreased. The third separation distance S3 is designed to be smaller than the preferred separation distance at the second green pixel G2 and the fourth green pixel G4 and thus light emission efficiency is decreased as the third separation distance S3 is decreased. The fourth separation distance G4 is designed to be smaller than the preferred separation distance at the second green pixel G2 and the fourth green pixel G4 and thus light emission efficiency is decreased as the fourth separation distance S4 is decreased. In one or more embodiments, the increase in the light emission efficiency according to the decreases of the first separation distance S1 and the second separation distance S2 is substantially equivalent to the decrease in the light emission efficiency according to the decreases of the third separation distance S3 and the fourth separation distance S4, thereby compensating for changes in the light emission efficiency (e.g., the changes to the light emission efficiency cancel each other out). That is, even if an error occurs in the process of fabricating the display device 1000 (e.g., an error occurs in fabricating the second opening 455 at the second green pixel G2 and the fourth green pixel G4), it is possible to prevent light emission efficiency from being changed. Accordingly, designing the first and second separation distances S1, S2 at the second green pixel G2 and the fourth green pixel G4 to be larger than the preferred separation distance and designing the third and fourth separation distances S3, S4 at the second green pixel G2 and the fourth green pixel G4 to be smaller than the preferred separation distance is configured to maintain a constant or substantially constant light emission efficiency of the display device 1000 if the size of the second opening 455 at the second green pixel G2 and the fourth green pixel G4 are smaller than designed.

As shown in FIG. 13, at the first green pixel G1, the second green pixel G2, the third green pixel G3, and the fourth green pixel G4 of the display device according to the exemplary embodiment, the first openings 195 may be patterned as designed and the second openings 455 may be patterned to be larger than designed. In this embodiment, the first separation distance S1, the second separation distance S2, the third separation distance S3, and the fourth separation distance S4 are included in the first green pixel G1, the second green pixel G2, the third green pixel G3, and the fourth green pixel G4.

The first separation distance S1 is designed to be smaller than the preferred separation distance at the first green pixel G1 and the third green pixel G3 and thus light emission efficiency is increased as the first separation distance S1 is increased. The second separation distance S2 is designed to be smaller than the preferred separation distance at the first green pixel G1 and the third green pixel G3 and thus light emission efficiency is increased as the second separation distance S2 is increased. The third separation distance S3 is designed to be larger than the preferred separation distance at the first green pixel G1 and the third green pixel G3 and thus light emission efficiency is decreased as the third separation distance S3 is increased. The fourth separation distance S4 is designed to be larger than the preferred separation distance at the first green pixel G1 and the third green pixel G3 and thus light emission efficiency is decreased as the fourth separation distance S4 is increased. In one or more embodiments, the increase in the light emission efficiency according to the increase of the first separation distance S1 and the second separation distance S2 is substantially equivalent to the decrease in the light emission efficiency according to the increase of the third separation distance S3 and the fourth separation distance S4, thereby compensating for changes in the light emission efficiency (e.g., the changes to the light emission efficiency cancel each other out). That is, even if an error occurs in the process of fabricating the display device 1000 (e.g., an error occurs in fabricating the second opening 455 at the first green pixel G1 and the third green pixel G3), it is possible to prevent light emission efficiency from being changed. Accordingly, designing the first and second separation distances S1, S2 at the first green pixel G1 and the third green pixel G3 to be smaller than the preferred separation distance and designing the third and fourth separation distances S3, S4 at the first green pixel G1 and the third green pixel G3 to be larger than the preferred separation distance is configured to maintain a constant or substantially constant light emission efficiency of the display device 1000 if the size of the second opening 455 at the first green pixel G1 and the third green pixel G3 are larger than designed.

The first separation distance S1 is designed to be larger than the preferred separation distance at the second green pixel G2 and the fourth green pixel G4 and thus light emission efficiency is decreased as the first separation distance S1 is increased. The second separation distance S2 is designed to be larger than the preferred separation distance at the second green pixel G2 and the fourth green pixel G4 and thus light emission efficiency is reduced as the second separation distance S2 is increased. The third separation distance S3 is designed to be smaller than the preferred separation distance at the second green pixel G2 and the fourth green pixel G4 and thus light emission efficiency is increased as the third separation distance S3 is increased. The fourth separation distance S4 is designed to be smaller than the preferred separation distance at the second green pixel G2 and the fourth green pixel G4 and thus light emission efficiency is increased as the fourth separation distance S4 is increased. In one or more embodiments, the decrease in the light emission efficiency according to the increase of the first separation distance S1 and the second separation distance S2 is substantially equivalent to the increase in the light emission efficiency according to the increase of the third separation distance S3 and the fourth separation distance S4, thereby compensating for changes in the light emission efficiency (e.g., the changes to the light emission efficiency cancel each other out). That is, even if an error occurs in the process of fabricating the display device 1000 (e.g., an error occurs in fabricating the second opening 455 at the second green pixel G2 and the fourth green pixel G4), it is possible to prevent light emission efficiency from being changed. Accordingly, designing the first and second separation distances S1, S2 at the second green pixel G2 and the fourth green pixel G4 to be larger than the preferred separation distance and designing the third and fourth separation distances S3, S4 at the second green pixel G2 and the fourth green pixel G4 to be smaller than the preferred separation distance is configured to maintain a constant or substantially constant light emission efficiency of the display device 1000 if the size of the second opening 455 at the second green pixel G2 and the fourth green pixel G4 are larger than designed.

As shown in FIG. 14, at the first green pixel G1, the second green pixel G2, the third green pixel G3, and the fourth green pixel G4 of the display device according to the exemplary embodiment, the first openings 195 may be patterned as designed and the second openings 455 may be patterned to be shifted more to the left side than designed. In this embodiment, the first separation distance S1 and the fourth separation distance S4 are increased and the second separation distance S2 and the third separation distance S3 are decreased in the first green pixel G1, the second green pixel G2, the third green pixel G3, and the fourth green pixel G4.

The first separation distance S1 is designed to be smaller than the preferred separation distance at the first green pixel G1 and the third green pixel G3 and thus light emission efficiency is increased as the first separation distance S1 is increased. The second separation distance S2 is designed to be smaller than the preferred separation distance at the first green pixel G1 and the third green pixel G3 and thus light emission efficiency is decreased as the second separation distance S2 is decreased. The third separation distance S3 is designed to be larger than the preferred separation distance at the first green pixel G1 and the third green pixel G3 and thus light emission efficiency is increased as the third separation distance S3 is decreased. The fourth separation distance S4 is designed to be larger than the preferred separation distance at the first green pixel G1 and the third green pixel G3 and thus light emission efficiency is decreased as the fourth separation distance S4 is increased.

Only at the first green pixel G1, the increase in the light emission efficiency according to the change of the first separation distance S1 and the third separation distance S3 is larger than the decrease in the light emission efficiency according to the change of the second separation distance S2 and the fourth separation distance S4. Only at the third green pixel G3, the increase in the light emission efficiency according to the change of the first separation distance S1 and the third separation distance S3 is smaller than the decrease in the light emission efficiency according to the change of the second separation distance S2 and the fourth separation distance S4. In one or more embodiments, a difference between the increase and the decrease in the light emission efficiency in the first green pixel G1 is substantially equivalent to a difference between the increase and the decrease in the light emission efficiency in the third green pixel G3, thereby compensating for the change in the light emission efficiency (e.g., the change in the light emission efficiency at the first green pixel G1 is cancelled out by the change in the light emission efficiency at the third green pixel G3). The number of first green pixels G1 and the number of third green pixels G3 are substantially equivalent to each other, and thus even if an error occurs in the process of fabricating the display device 1000, it is possible to prevent light emission efficiency from being changed. Accordingly, designing the first and second separation distances S1, S2 at the first green pixel G1 and the third green pixel G3 to be smaller than the preferred separation distance and designing the third and fourth separation distances S3, S4 at the first green pixel G1 and the third green pixel G3 to be larger than the preferred separation distance is configured to maintain a constant or substantially constant light emission efficiency of the display device 1000 if the positions of the second opening 455 at the first green pixel G1 and the third green pixel G3 are more to the left than designed.

The first separation distance S1 is designed to be larger than the preferred distance at the second green pixel G2 and the fourth green pixel G4 and thus light emission efficiency is decreased as the first separation distance S1 is increased. The second separation distance S2 is designed to be larger than the preferred distance at the second green pixel G2 and the fourth green pixel G4 and thus light emission efficiency is increased as the second separation distance S2 is decreased. The third separation distance S3 is designed to be smaller than the preferred distance at the second green pixel G2 and the fourth green pixel G4 and thus light emission efficiency is decreased as the third separation distance S3 is decreased. The fourth separation distance S4 is designed to be smaller than the preferred distance at the second green pixel G2 and the fourth green pixel G4 and thus light emission efficiency is increased as the fourth separation distance S4 is increased.

Only at the second green pixel G2, the decrease in the light emission efficiency according to the change of the first separation distance S1 and the third separation distance S3 is smaller than the increase in the light emission efficiency according to the change of the second separation distance S2 and the fourth separation distance S4. Only at the fourth green pixel G4, the decrease in the light emission efficiency according to the change of the first separation distance S1 and the third separation distance S3 is larger than the increase in the light emission efficiency according to the change of the second separation distance S2 and the fourth separation distance S4. In one or more embodiments, a difference between the increase and the decrease in the light emission efficiency at the second green pixel G2 is substantially equivalent to a difference between the increase and the decrease in the light emission efficiency in the fourth green pixel G4, thereby compensating for the changes in the light emission efficiency (e.g., the change in the light emission efficiency at the second green pixel G2 is cancelled out by the change in the light emission efficiency at the fourth green pixel G4). The number of second green pixels G2 and the number of fourth green pixels G4 are substantially equivalent to each other and thus even if an error occurs in the process, it is possible to prevent light emission efficiency from being changed. Accordingly, designing the first and second separation distances S1, S2 at the second green pixel G2 and the fourth green pixel G4 to be larger than the preferred separation distance and designing the third and fourth separation distances S3, S4 at the second green pixel G2 and the fourth green pixel G4 to be smaller than the preferred separation distance is configured to maintain a constant or substantially constant light emission efficiency of the display device 1000 if the positions of the second opening 455 at the second green pixel G2 and the fourth green pixel G4 are shifted more to the left than designed.

As shown in FIG. 15, at the first green pixel G1, the second green pixel G2, the third green pixel G3, and the fourth green pixel G4 of the display device according to the exemplary embodiment, the first openings 195 may be patterned as designed and the second openings 455 may be patterned to be shifted more to the right side than designed. In this case, the first separation distance S2 and the fourth separation distance S4 are decreased and the second separation distance S2 and the third separation distance S3 are increased in the first green pixel G1, the second green pixel G2, the third green pixel G3, and the fourth green pixel G4.

The first separation distance S1 is designed to be smaller than the preferred separation distance at the first green pixel G1 and the third green pixel G3 and thus light emission efficiency is decreased as the first separation distance S1 is decreased. The second separation distance S2 is designed to be smaller than the preferred separation distance at the first green pixel G1 and the third green pixel G3 and thus light emission efficiency is increased as the second separation distance S2 is increased. The third separation distance S3 is designed to be larger than the preferred separation distance at the first green pixel G1 and the third green pixel G3 and thus light emission efficiency is decreased as the third separation distance S3 is increased. The fourth separation distance S4 is designed to be larger than the preferred separation distance at the first green pixel G1 and the third green pixel G3 and thus light emission efficiency is increased as the fourth separation distance S4 is decreased.

At only the first green pixel G1, the decrease in the light emission efficiency according to the change of the first separation distance S1 and the third separation distance S3 is larger than the increase in the light emission efficiency according to the change of the second separation distance S2 and the fourth separation distance S4. AT only the third green pixel G3, the decrease in the light emission efficiency according to the change of the first separation distance S1 and the third separation distance S3 is smaller than the increase in the light emission efficiency according to the change of the second separation distance S2 and the fourth separation distance S4. In one or more embodiments, a difference between the decrease and the increase in the light emission efficiency at the first green pixel G1 and a difference between the decrease and the increase in the light emission efficiency at the third green pixel G3 are substantially equivalent to each other, thereby compensating for the changes in the light emission efficiency (e.g., the change in the light emission efficiency at the first green pixel G1 is cancelled out by the change in the light emission efficiency at the third green pixel G3). The number of first green pixels G1 and the number of third green pixels G3 are substantially the same and thus even if an error occurs in the process, it is possible to prevent light emission efficiency from being changed. Accordingly, designing the first and second separation distances S1, S2 at the first green pixel G1 and the third green pixel G3 to be smaller than the preferred separation distance and designing the third and fourth separation distances S3, S4 at the first green pixel G1 and the third green pixel G3 to be larger than the preferred separation distance is configured to maintain a constant or substantially constant light emission efficiency of the display device 1000 if the positions of the second opening 455 at the first green pixel G1 and the third green pixel G3 are shifted more to the right than designed.

The first separation distance S1 is designed to be larger than the preferred separation distance at the second green pixel G2 and the fourth green pixel G4 and thus light emission efficiency is increased as the first separation distance S1 is decreased. The second separation distance S2 is designed to be larger than the preferred separation distance at the second green pixel G2 and the fourth green pixel G4 and thus light emission efficiency is decreased as the second separation distance S2 is increased. The third separation distance S3 is designed to be smaller than the preferred separation distance at the second green pixel G2 and the fourth green pixel G4 and thus light emission efficiency is increased as the third separation distance S3 is increased. The fourth separation distance S4 is designed to be smaller than the preferred separation distance at the second green pixel G2 and the fourth green pixel G4 and thus light emission efficiency is decreased as the fourth separation distance S4 is decreased.

At only the second green pixel G2, the increase in the light emission efficiency according to the change of first separation distance S1 and the third separation distance S3 is smaller than the decrease in the light emission efficiency according to the change of the second separation distance S2 and the fourth separation distance S4. At only the fourth green pixel G4, the increase in the light emission efficiency according to the change of first separation distance S1 and the third separation distance S3 is larger than the decrease in the light emission efficiency according to the change of the second separation distance S2 and the fourth separation distance S4. In one or more embodiments, a difference between the increase and the decrease in the light emission efficiency in the second green pixel G2 is substantially equivalent to a difference between the increase and the decrease in the light emission efficiency in the fourth green pixel G4, thereby compensating for the change in the light emission efficiency (e.g., the change in the light emission efficiency at the second green pixel G2 is cancelled out by the change in the light emission efficiency at the fourth green pixel G4). The number of second green pixels G2 and the number of fourth greens pixel G4 are substantially equivalent to each other and thus even if an error occurs in the process, it is possible to prevent light emission efficiency from being changed. Accordingly, designing the first and second separation distances S1, S2 at the second green pixel G2 and the fourth green pixel G4 to be larger than the preferred separation distance and designing the third and fourth separation distances S3, S4 at the second green pixel G2 and the fourth green pixel G4 to be smaller than the preferred separation distance is configured to maintain a constant or substantially constant light emission efficiency of the display device 1000 if the positions of the second opening 455 at the second green pixel G2 and the fourth green pixel G4 are shifted more to the right than designed.

In the display device 1000 according to the exemplary embodiment, the first opening 195 of the green pixel G is formed in the rectangular shape, the first separation distance S1 and the second separation distance S2 are equivalent to each other, the third separation distance S3 and the fourth separation distance S4 are equivalent to each other, and the first separation distance S1 and the third separation distance S3 are different than each other in the green pixel G. However, the design of the green pixel G is not limited thereto, and the first separation distance S1 and the second separation distance S2 may be different than each other, the first separation distance S1 and the third separation distance S3 may be equivalent to each other, and the second separation distance S2 and the fourth separation distance S4 may be equivalent to each other. In this embodiment, when an error occurs in a process of fabricating the display device 1000, the increase in the light emission efficiency in some area and the decrease in the light emission efficiency in another area may be different from each other, thereby causing a change in the entire light emission efficiency of the display device 100. However, even in this embodiment, the change in the light emission efficiency of the display device 1000 can be reduced compared to an embodiment in which the first to fourth separation distances S1 to S4 are equivalent to each other.

Next, referring to FIG. 16 and FIG. 17, a display device according to an exemplary embodiment will be described.

Figure 16:
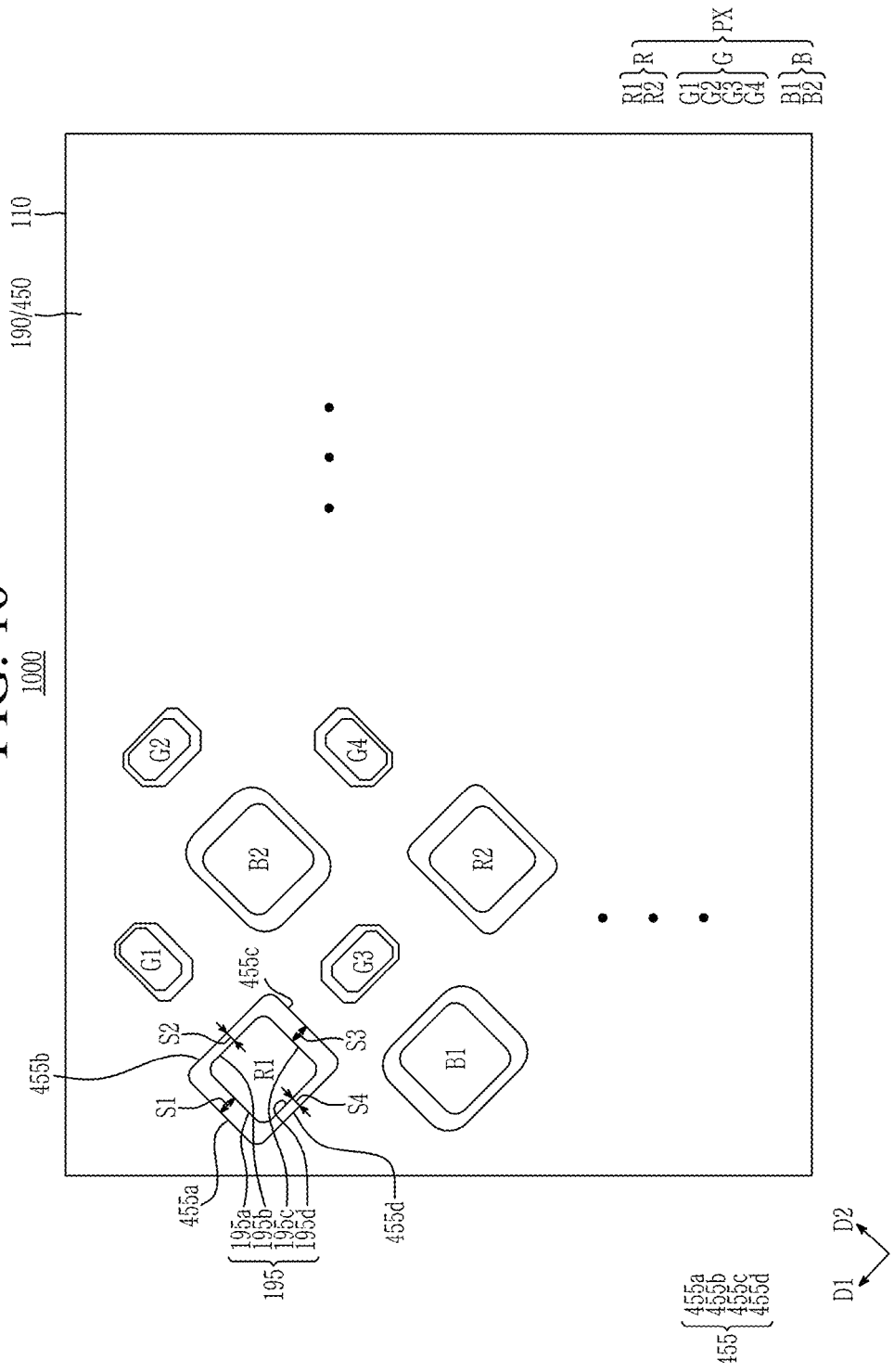
FIG. 16 is a schematic top plan view of a display device according to an exemplary embodiment.
Figure 17:
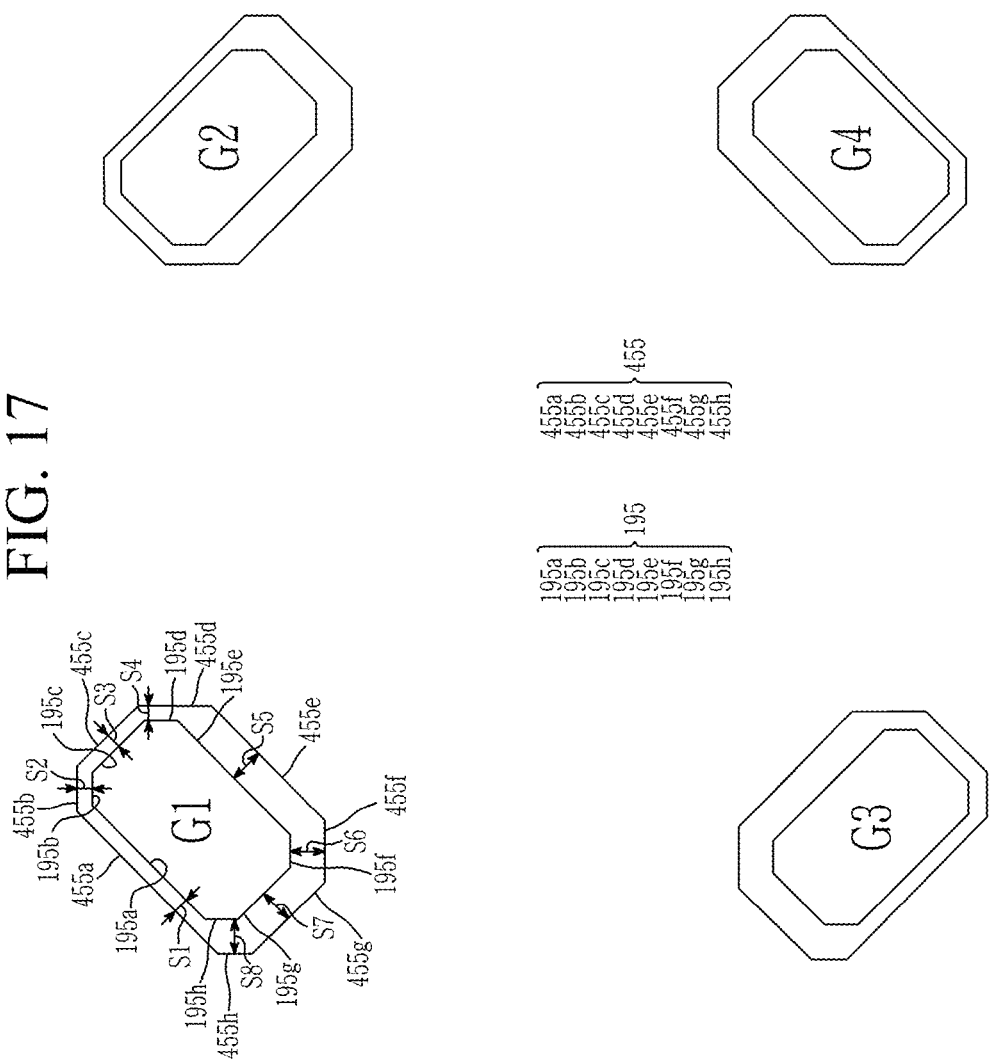
FIG. 17 is a top plan view of some enlarged pixels of the display device according to the exemplary embodiment.

A display device according to an exemplary embodiment shown in FIG. 16 and FIG. 17 is similar to the display device according to the exemplary embodiment shown in FIG. 1 to FIG. 15, and therefore a description of the same parts will be omitted. In the present exemplary embodiment, the shape of the green pixel is different from the previous exemplary embodiment, and is further described below.

FIG. 16 is a schematic top plan view of a display device according to an exemplary embodiment, and FIG. 17 is a top plan view of some enlarged pixels of the display device according to the exemplary embodiment.

As shown in FIG. 16 and FIG. 17, a display device 1000 according to the present exemplary embodiment includes a substrate 110, a partitioning wall 190, and a low refractive layer 450. The partitioning wall 190 may include a first opening 195, and the low refractive layer 450 may include a second opening 455. A plurality of pixels PX are on the substrate 110, and the first opening 195 and the second opening 455 may be located at each of the plurality of pixels PX. The plurality of pixels PX may include red pixels R, green pixels G, and blue pixels B.

The planar shapes of the first opening 195 and the second opening 455 may be polygons including a plurality of sides. The first opening 195 and the second opening 455 at the red pixel R and the blue pixel B may be formed approximately in a quadrangle shape, and corners may be chamfered. The first opening 195 and the second opening 455 at the green pixel G may be formed in an approximate octagonal shape. The red pixel R and the blue pixel B will not be described because they are the same as those described in the above-stated exemplary embodiment, and the green pixel G will now be described.

The first opening 195 at the green pixel G includes a first side 195*a*, a second side 195*b* adjacent to the first side 195*a* in a clockwise direction, a third side 195*c* adjacent to the second side 195*b* in the clockwise direction, a fourth side 195*d* adjacent to the third side 195 in the clockwise direction, a fifth side 195*e* adjacent to the fourth side 195*d* in the clockwise direction, a sixth side 195*f* adjacent to the fifth side 195*e* in the clockwise direction, a seventh side 195*g* adjacent to the sixth side 195*f* in the clockwise direction, and an eighth side 195*h* adjacent to the seventh side 195*g* in the clockwise direction. The eighth side 195*h* of the first opening 195 in the green pixel G may be adjacent to the first side 195*a*. The second opening 455 at the green pixel G may include a first side 455*a*, a second side 455*b* adjacent to the first side 455*a* in the clockwise direction, a third side 455*c* adjacent to the second side 455*b* in the clockwise direction, a fourth side 455*d* adjacent to the third side 455*c* in the clockwise direction, a fifth side 455*e* adjacent to the fourth side 455*d* in the clockwise direction, a sixth side 455*f* adjacent to the fifth side 455*e* in the clockwise direction, a seventh side 455*g* adjacent to the sixth side 455*f* in the clockwise direction, and an eighth side 455*h* adjacent to the seventh side 455*g* in the clockwise direction. The eighth side 455*h* of the second opening 455 at the green pixel G may be adjacent to the first side 455*a*.

The first side 195*a* of the first opening 195 at the green pixel G may be adjacent or proximate to the first side 455*a* of the second opening 455, and they may be parallel or substantially parallel with each other. The second side 195*b* of the first opening 195 in the green pixel G may be adjacent or proximate to the second side 455*b* of the second opening 455, and they may be parallel or substantially parallel with each other. The third side 195*c* of the first opening 195 in the green pixel G may be adjacent or proximate to the third side 455c of the second opening 455, and they may be parallel or substantially parallel with each other. The fourth side 195d of the first opening 195 in the green pixel G may be adjacent or proximate to the fourth side 455d of the second opening 455, and they may be parallel or substantially parallel with each other. The fifth side 195e of the first opening 195 in the green pixel G may be adjacent or proximate to the fifth side 455e of the second opening 455, and they may be parallel or substantially parallel with each other. The sixth side 195f of the first opening 195 in the green pixel G may be adjacent or proximate to the sixth side 455f of the second opening 455, and they may be parallel or substantially parallel with each other. The seventh side 195g of the first opening 195 in the green pixel G may be adjacent or proximate to the seventh side 455g of the second opening 455, and they may be parallel or substantially parallel with each other. The eighth side 195h of the first opening 195 in the green pixel G may be adjacent or proximate to the eighth side 455h of the second opening 455, and they may be parallel or substantially parallel with each other.

In this embodiment, a shortest separation distance between the first side 195a of the first opening 195 and the second opening 455 is defined as a first separation distance S1. That is, the first separation distance S1 refers to the shortest distance (i.e., a straight-line separation distance) between the first side 195a of the first opening 195 and the first side 455a of the second opening 455. In addition, a shortest distance between the second side 195b of the first opening 195 and the second opening 455 is defined as a second separation distance S2. That is, the second separation distance S2 refers to the shortest distance (i.e., a straight-line separation distance) between the second side 195b of the first opening 195 and the second side 455b of the second opening 455. In addition, a shortest distance between the third side 195c of the first opening 195 and the second opening 455 is defined as a third separation distance S3. That is, the third separation distance S3 refers to the shortest distance (i.e., a straight-line separation distance) between the third side 195c of the first opening 195 and the third side 455c of the second opening 455. In addition, a shortest distance between the fourth side 195d of the first opening 195 and the second opening 455 is defined as a fourth separation distance S4. That is, the fourth separation distance S4 refers to the shortest distance (i.e., a straight-line separation distance) between the fourth side 195d of the first opening 195 and the fourth side 455d of the second opening 455. A shortest distance between the fifth side 195e of the first opening 195 and the second opening 455 is defined as a fifth separation distance S5. That is, the fifth separation distance S5 refers to the shortest distance (i.e., a straight-line separation distance) between the fifth side 195e of the first opening 195 and the fifth side 455e of the second opening 455. In addition, a shortest distance between the sixth side 195f of the first opening 195 and the second opening 455 is defined as a sixth separation distance S6. That is, the sixth separation distance S6 refers to the shortest distance (i.e., a straight-line separation distance) between the sixth side 195f of the first opening 195 and the sixth side 455f of the second opening 455. In addition, a shortest distance between the seventh side 195g of the first opening 195 and the second opening 455 is defined as a seventh separation distance S7. That is, the seventh separation distance S7 refers to the shortest distance (i.e., a straight-line separation distance) between the seventh side 195g of the first opening 195 and the seventh side 455g of the second opening 455. In addition, a shortest distance between the eighth side 195h of the first opening 195 and the second opening 455 is defined as an eighth separation distance S8. That is, the eighth separation distance S8 refers to the shortest distance (i.e., a straight-line separation distance) between the eighth side 195h of the first opening 195 and the eighth side 455h of the second opening 455.

The green pixel G may include a first green pixel G1, a second green pixel G2, a third green pixel G3, and a fourth green pixel G4. The first openings 195 at the first green pixel G1, the second green pixel G2, the third green pixel G3, and the fourth green pixel G4 may be formed approximately in the shape of an octagon. In this embodiment, in the first openings 195 at the first green pixel G1, the second green pixel G2, the third green pixel G3, and the fourth green pixel G4, two sides facing each other may have substantially the same length. The first side 195a and the fifth side 195e of the first opening 195 may have substantially the same length. The second side 195b and the sixth side 195f of the first opening 195 may have substantially the same length. The third side 195c and the seventh side 195g of the first opening 195 may have substantially the same length. The fourth side 195d and the eighth side 195h of the first opening 195 may have substantially the same length. In the first opening 195 at the first green pixel G1 and the fourth green pixel G4, the first side 195a and the fifth side 195e may be longer than the third side 195c and the seventh side 195g. In the first opening 195 at the first green pixel G1 and the fourth green pixel G4, the third side 195c and the seventh side 195g may be longer than the second side 195b, the fourth side 195d, the sixth side 195f, and the eighth side 195h. In the first opening 195 at the second green pixel G2 and the third green pixel G3, the first side 195a and the fifth side 195e may be shorter than the third side 195c and the seventh side 195g. In the first opening 195 at the first green pixel G1 and the fourth green pixel G4, the second side 195b, the fourth side 195d, the sixth side 195f, and the eighth side 195h may be shorter than the first side 195a and the fifth side 195e.

The second openings 455 at the first green pixel G1, the second green pixel G2, the third green pixel G3, and the fourth green pixel G4 may be formed in the shape of an octagon. Alternatively, the second openings 455 at the first green pixel G1, the second green pixel G2, the third green pixel G3, and fourth green pixel G4 may have a shape that is similar to the shape of the first opening 195.

A distance between any one side of the first opening 195 and the second opening 455 in the green pixel G may be different from a distance between any other side of the first opening 195 and the second opening 455.

At the first green pixel G1, a first separation distance S1, a second separation distance S2, a third separation distance S3, and a fourth separation distance S4 may be different from a fifth separation distance S5, a sixth separation distance S6, a seventh separation distance S7, and an eighth separation distance S8. At the first green pixel G1, the first separation distance S1, the second separation distance S2, the third separation distance S3, and the fourth separation distance S4 may be substantially equivalent to each other. At the first green pixel G1, the fifth separation distance S5, the sixth separation distance S6, the seventh separation distance S7, and the eighth separation distance S8 may be substantially equivalent to each other. At the first green pixel G1, the first separation distance S1 may be smaller than the fifth separation distance S5.

At the second green pixel G2, the eighth separation distance S8, the first separation distance S1, the second separation distance S2, and the third separation distance S3 may be different from the fourth separation distance S4, the fifth separation distance S5, the sixth separation distance S6, and the seventh separation distance S7. At the second green pixel G2, the eighth separation distance S8, the first separation distance S1, the second separation distance S2, and the third separation distance S3 may be substantially equivalent to each other. At the second green pixel G2, the fourth separation distance S4, the fifth separation distance S5, the sixth separation distance S6, and the seventh separation distance S7 may be substantially equivalent to each other. At the second green pixel G2, the first separation distance S1 may be smaller than the fifth separation distance S5.

At the third green pixel G3, the eighth separation distance S8, the first separation distance S1, the second separation distance S2, and the third separation distance S3 may be different from the fourth separation distance S4, the fifth separation distance S5, the sixth separation distance S6, and the seventh separation distance S7. At the third green pixel G3, the eighth separation distance S8, the first separation distance S1, the second separation distance S2, and the third separation distance S3 may be substantially equivalent to each other. At the second green pixel G2, the fourth separation distance S4, the fifth separation distance S5, the sixth separation distance S6, and the seventh separation distance S7 may be substantially equivalent to each other. At the third green pixel G3, the first separation distance S1 may be larger than the fifth separation distance S5.

At the fourth green pixel G4, the first separation distance S1, the second separation distance S2, the third separation distance S3, and the fourth separation distance S4 may be different from the fifth separation distance S5, the sixth separation distance S6, the seventh separation distance S7, and the eighth separation distance S8. At the first green pixel G1, the first separation distance S1, the second separation distance S2, the third separation distance S3, and the fourth separation distance S4 may be substantially equivalent to each other. At the first green pixel G1, the fifth separation distance S5, the sixth separation distance S6, the seventh separation distance S7, and the eighth separation distance S8 may be substantially equivalent to each other. At the first green pixel G1, the first separation distance S1 may be larger than the fifth separation distance S5.

In FIG. 16, one first green pixel G1, one second green pixel G2, one third green pixel G3, and one fourth green pixel G4 are illustrated, but the display device 1000 may include a plurality of first green pixels G1, a plurality of second green pixels G2, a plurality of third green pixels G3, and a plurality of fourth green pixels G4. In this embodiment, the number of first green pixels G1, the number of second green pixels G2, the number of third green pixels G3, and the number of fourth green pixels G4 may be substantially equivalent to each other.

At first green pixel G1, the first separation distance S1, the second separation distance S2, the third separation distance S3, and the fourth separation distance S4 may be smaller than a preferred separation distance, as defined above. At the first green pixel G1, the fifth separation distance S5, the sixth separation distance S6, the seventh separation distance S7, and the eighth separation distance S8 may be larger than the preferred separation distance. At the second green pixel G2, the eighth separation distance S8, the first separation distance S1, the second separation distance S2, and the third separation distance S3 may be smaller than the preferred separation distance. At the second green pixel G2, the fourth separation distance S4, the fifth separation distance S5, the sixth separation distance S6, and the seventh separation distance S7 may be larger than the preferred separation distance. At the third green pixel G3, the eighth separation distance S8, the first separation distance S1, the second separation distance S2, and the third separation distance S3 may be larger than the preferred separation distance. At the third green pixel G3, the fourth separation distance S4, the fifth separation distance S5, the sixth separation distance S6, and the seventh separation distance S7 may be smaller than the preferred separation distance. At the fourth green pixel G4, the first separation distance S1, the second separation distance S2, the third separation distance S3, and the fourth separation distance S4 may be larger than the preferred separation distance. At the fourth green pixel G4, the fifth separation distance S5, the sixth separation distance S6, the seventh separation distance S7, and the eighth separation distance S8 may be smaller than the preferred separation distance.

At the first green pixel G1, the second green pixel G2, the third green pixel G3, and the fourth green pixel G4, the first to eighth separation distances S1, S2, S3, S4, S5, S6, S7, and S8 may be different than the preferred separation distance by about 0.1 µm or more and less than about 1.0 µm. That is, at least one of the first to eighth separation distances S1, S2, S3, S4, S5, S6, S7, and S8 may be about 1.4 µm or more and less than about 2.3 µm, and the other separation distances of the first to eighth separation distances S1, S2, S3, S4, S5, S6, S7, and S8 may be about 0.3 µm or more and less than about 1.2 µm. Thus, in the first green pixel G1, the second green pixel G2, the third green pixel G3, and the fourth green pixel G4, a difference between the first separation distance S1 and the fifth separation distance S5 may be about 0.2 µm or more and less than about 2.0 µm.

In the display device 1000 according to the present exemplary embodiment, separation distances within one pixel PX are designed different from each other, thereby preventing variations in light emission efficiency even when an error occurs in the process of manufacturing the display device 1000. In the present exemplary embodiment, the principle of compensating for the change in the light emission efficiency of the green pixel G is substantially equivalent to the manner described above with reference to the previous exemplary embodiment.

Next, a display device according to an exemplary embodiment will be described with reference to FIG. 18 and FIG. 19.

Figure 18:
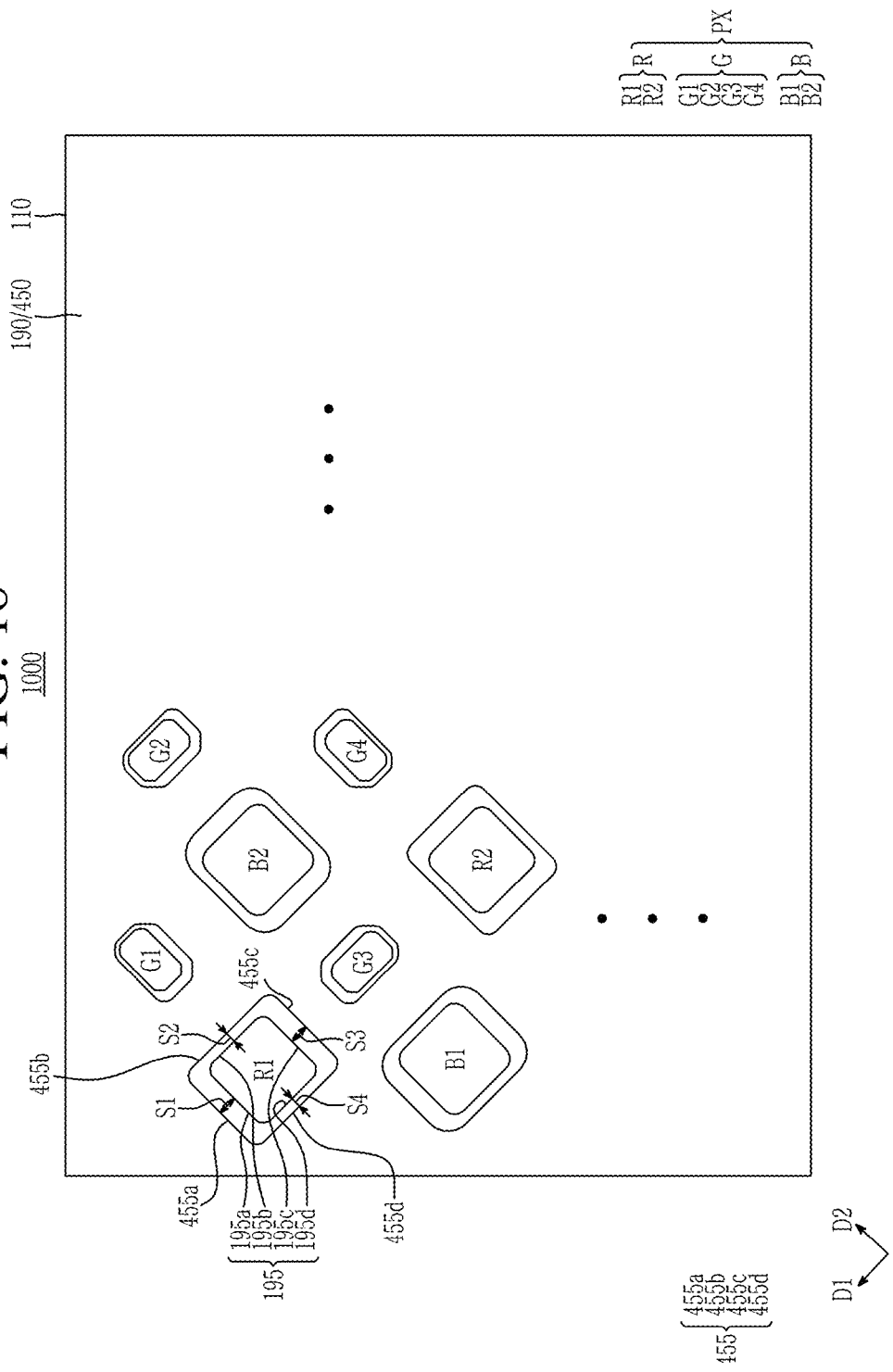
FIG. 18 is a schematic top plan view of a display device according to an exemplary embodiment.
Figure 19:
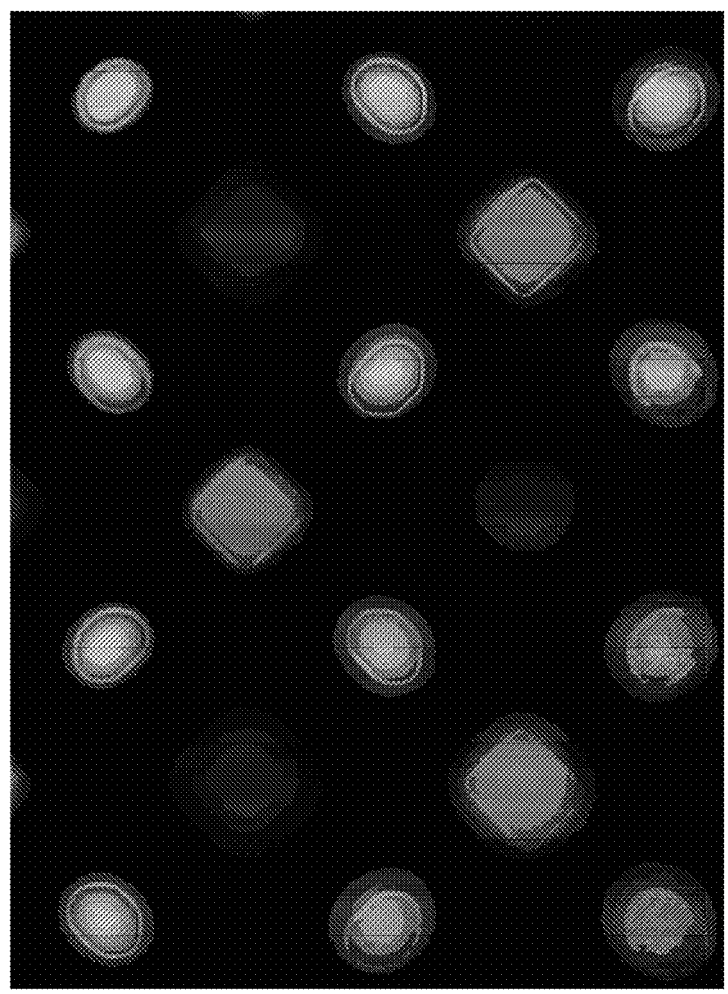
FIG. 19 shows actual implementation of the display device according to the exemplary embodiment.

A display device according to an exemplary embodiment shown in FIG. 18 and FIG. 19 is similar to the display device of the exemplary embodiment shown in FIG. 16 and FIG. 17, and therefore a description for the same parts will be omitted. In the present exemplary embodiment, the shape of the green pixel is different from the previous exemplary embodiment, and is further described below.

FIG. 18 is a schematic top plan view of a display device according to an exemplary embodiment, and FIG. 19 shows an implementation of the display device according to the exemplary embodiment.

As shown in FIG. 18, a display device 1000 according to an exemplary embodiment includes a substrate 110, a partitioning wall 190 that overlaps the substrate 110, and a low refractive layer 450. The partitioning wall 190 may include a first opening 195, and the low refractive layer 450 may include a second opening 455. A plurality of pixels PX are on the substrate 110, and the first opening 195 and the second opening 455 may be located at each of the plurality of pixels PX. The plurality of pixels PX may include red pixels R, green pixels G, and blue pixels B.

The planar shapes of the first opening 195 and the second opening 455 may be polygons including a plurality of sides. The first opening 195 and the second opening 455 at the red pixel R and the blue pixel B may be formed approximately in a quadrangle shape, and corners of the first opening 195 and the second opening 455 may be chamfered.

As in the previously described exemplary embodiment, the first opening 195 and the second opening 455 at the green pixel G may be formed in an approximate octagonal shape. In the present exemplary embodiment, the first openings 195 and second openings 455 at the green pixel G may be chamfered. Corners of the first opening 195 and second opening 455 at the green pixel G may be chamfered with a curved line. The first opening 195 and the second opening 455 at the green pixel G may have a substantially oval shape. FIG. 19 shows an implementation of the display device according to the exemplary embodiment. It can be determined through FIG. 19 that the first opening 195 and the second opening 455 at the green pixel G are rounded overall, while having one flat side.

Next, referring to FIG. 20, a display device according to an exemplary embodiment will be described.

Figure 20:
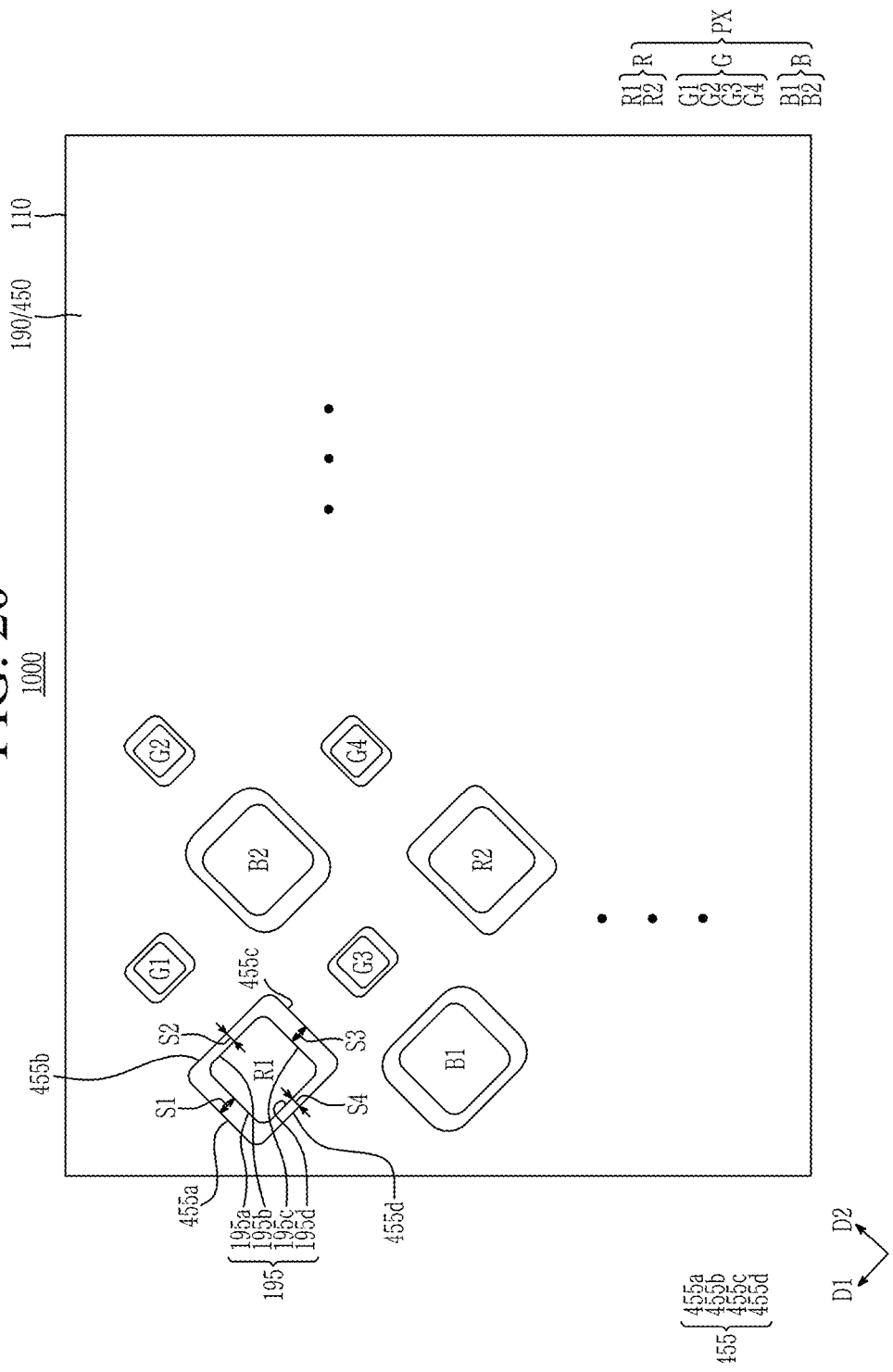
FIG. 20 is a schematic top plan view of a display device according to an exemplary embodiment.

A display device according to an exemplary embodiment shown in FIG. 20 is similar to the display device according to the exemplary embodiment shown in FIG. 1 to FIG. 15, and therefore a description of the same parts will be omitted. In the present exemplary embodiment, the shape of the green pixel is different from the previous exemplary embodiment, and is further described below.

FIG. 20 is a schematic top plan view of a display device according to an exemplary embodiment.

As shown in FIG. 20, a display device 1000 according to an exemplary embodiment includes a substrate 110, a partitioning wall 190 that overlaps the substrate 110, and a low refractive layer 450. The partitioning wall 190 may include a first opening 195, and the low refractive layer 450 may include a second opening 455. A plurality of pixels PX are on the substrate 110, and the first opening 195 and the second opening 455 may be provided at each of the plurality of pixels PX. The plurality of pixels PX may include red pixels R, green pixels G, and blue pixels B.

The planar shapes of the first opening 195 and the second opening 455 may be polygons including a plurality of sides. The first opening 195 and the second opening 455 at the red pixel R and the blue pixel B may be formed approximately in a quadrangle shape, and corners of the first opening 195 and the second opening 455 may be chamfered.

In the previously described exemplary embodiment, the first opening 195 at the green pixel G is formed in the shape of a rectangle, and in the present exemplary embodiment, the first opening 195 at the green pixel G may be formed in the shape of a square. That is, in one or more embodiments, the first opening 195 at all the pixels PX may be formed in the shape of a square.

At the first green pixel G1 and the third green pixel G3, the first separation distance S1 and the third separation distance S3 may be substantially equivalent to each other, and the second separation distance S2 and the fourth separation distance S4 may be substantially equivalent to each other. At the first green pixel G1 and the second green pixel G2, the first separation distance S1 may be larger than the second separation distance S2, and the first separation distance S1 may be larger than the fourth separation distance S4. At the first green pixel G1 and the second green pixel G2, the third separation distance S3 may be larger than the second separation distance S2, and the third separation distance S3 may be larger than the fourth separation distance S4. Thus, at the first green pixel G1 and the third green pixel G3, the second opening 455 may be formed in the shape of a rectangle that extends in a first direction D1.

At the second green pixel G2 and the fourth green pixel G4, the first separation distance S1 may be substantially equivalent to the third separation distance S3 and the second separation distance S2 may be substantially equivalent to the fourth separation distance S4. At the second green pixel G2 and the fourth green pixel G4, the first separation distance S1 may be smaller than the second separation distance S2 and the first separation distance S1 may be smaller than the fourth separation distance S4. At the second green pixel G2 and the fourth green pixel G4, the third separation distance S3 may be smaller than the second separation distance S2 and the third separation distance S3 may be smaller than the fourth separation distance S4. Thus, the second opening 455 at the second green pixel G2 and the fourth green pixel G4 may be formed in the shape of a rectangle extending in a second direction D2.

The number of first green pixels G1, the number of second green pixels G2, the number of third green pixels G3, and the number of fourth green pixels G4 may be substantially equivalent to each other.

In the present exemplary embodiment, the first opening 195 at all of the pixels PX is formed in the shape of a square, but the present disclosure is not limited thereto. The shape of the first opening 195 can be variously modified. For example, the first pixel 195 in all of the pixels PX may be formed in the shape of a rectangle.

Next, a display device according to an exemplary embodiment will be described with reference to FIG. 21.

A display device according to an exemplary embodiment shown in FIG. 21 is almost the same as the display device according to the exemplary embodiment shown in FIG. 1 to FIG. 15, and therefore a description of the same parts will be omitted. In the present exemplary embodiment, the features of second openings are different from the previous exemplary embodiment, and are further described below.

FIG. 21 is a schematic top plan view of a display device according to an exemplary embodiment.

As shown in FIG. 21, a display device 1000 according to an exemplary embodiment includes a substrate 110, a partitioning wall 190 that overlaps the substrate 110, and a low refractive layer 450. The partitioning wall 190 may include a first opening 195, and the low refractive layer 450 may include a second opening 455. A plurality of pixels PX are on the substrate 110, and the first opening 195 and the second opening 455 may be provided at each of the plurality of pixels PX. The plurality of pixels PX may include red pixels R, green pixels G, and blue pixels B.

In the previous exemplary embodiment, the second opening 455 at the first red pixel R1 may be formed in the shape of a rectangle extending in a first direction D1, and a second opening 455 at the second red pixel R2 may be formed in the shape of a rectangle extending in a second direction D2. In the present exemplary embodiment, the second opening 455 at the first red pixel R1 has a shape that is substantially the same as the shape of the second opening 455 at the second red pixel R2. That is, all of the second openings 455 at the first red pixel R1 and the second red pixel R2 may be formed in the shape of a rectangle extending in the first direction D1. Thus, a first separation distance S1 may be larger than a second separation distance S2 at each of the first red pixel R1 and the second red pixel R2.

Likewise, the second opening 455 at the first blue pixel B1 may have a shape that is substantially the same as the shape of the second opening 455 at the second blue pixel B2. That is, all of the second openings 455 at the first blue pixel B1 and the second blue pixel B2 may be formed in the shape of a rectangle extending in the first direction D1. Thus, a first separation distance S1 may be larger than a second separation distance S2 at each of the first blue pixel B1 and the second blue pixel B2.

In the previous exemplary embodiment, the first separation distance S1 may be smaller than the third separation distance S3 at the first green pixel G1 and the third green pixel G3, and the first separation distance S1 may be larger than the third separation distance S3 at the second green pixel G2 and the fourth green pixel G4. In the present exemplary embodiment, the first separation distances S1 may be smaller than the third separation distance S3 at the first green pixel G1, the second green pixel G2, the third green pixel G3, and the fourth green pixel G4.

Next, referring to FIG. 22, a display device according to an exemplary embodiment will be described.

A display device according to an exemplary embodiment shown in FIG. 22 is almost the same as the display device according to the exemplary embodiment shown in FIG. 1 to FIG. 15, and therefore a description of the same parts will be omitted. In the present exemplary embodiment, the shape of the green pixel is different from the previous exemplary embodiment, and is further described below.

FIG. 22 is a schematic top plan view of a display device according to an exemplary embodiment.

As shown in FIG. 22, a display device 1000 according to an exemplary embodiment includes a substrate 110, a partitioning wall 190 that overlaps the substrate 110, and a low refractive layer 450. The partitioning wall 190 may include a first opening 195, and the low refractive layer 450 may include a second opening 455. A plurality of pixels PX are on the substrate 110, and the first opening 195 and the second opening 455 may be provided at each of the plurality of pixels PX. The plurality of pixels PX may include red pixels R, green pixels G, and blue pixels B.

In the previous exemplary embodiment, the second opening 455 at the first red pixel R1 may be formed in the shape of a rectangle extending in a first direction D1, and a second opening 455 at the second red pixel R2 may be formed in the shape of a rectangle extending in a second direction D2. In the present exemplary embodiment, the second opening 455 at the first red pixel R1 has a shape that is substantially the same as the shape of the second opening 455 at the second red pixel R2. That is, all of the second openings 455 at the first red pixel R1 and the second red pixel R2 may be formed in the shape of a rectangle extending in a second direction D2. Thus, a first separation distance S1 may be smaller than a second separation distance S2 at each of the first red pixel R1 and the second red pixel R2.

Likewise, the second opening 455 at the first blue pixel B1 may have a shape that is substantially the same as the shape of the second opening 455 at the second blue pixel B2. That is, all of the second openings 455 at the first blue pixel B1 and the second blue pixel B2 may be formed in the shape of a rectangle extending in the second direction D2. Thus, a first separation distance S1 may be smaller than a second separation distance S2 at each of the first blue pixel B1 and the second blue pixel B2.

In the previous exemplary embodiment, the first separation distance S1 may be smaller than the third separation distance S3 at the first green pixel G1 and the third green pixel G3, and the first separation distance S1 may be larger than the third separation distance S3 at the second green pixel G2 and the fourth green pixel G4. In the present exemplary embodiment, the first separation distance S1 may be larger than the third separation distance S3 at the first green pixel G1, the second green pixel G2, the third green pixel G3, and the fourth green pixel G4.

While this disclosure has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims.

DESCRIPTION OF SYMBOLS

110: substrate
190: partitioning wall
195: first opening
450: low refractive layer
455: second opening

What is claimed is:

1. A display device comprising:
a substrate;
a plurality of pixels on the substrate;
a first electrode on the substrate;
a partitioning wall on the first electrode, the partitioning wall comprising a first opening that overlaps the first electrode and a pixel of the plurality of pixels;
a touch detection electrode on the partitioning wall;
a low refractive layer on the partitioning wall and the touch detection electrode, the low refractive layer comprising a second opening that overlaps the first opening and the pixel; and
a high refractive layer on the low refractive layer,
wherein planar shapes of the first opening and the second opening are polygons comprising a plurality of sides,
wherein a shortest distance between one side of the plurality of sides of the first opening and the second opening is different than a distance from another side of the plurality of sides of the first opening and the second opening in a plan view, and
wherein the shortest distance between the one side of the first opening and the second opening is less than a predetermined value at which light emission efficiency of the pixel is a maximum, and the distance between the another side of the first opening and the second opening is greater than the predetermined value at which the light emission efficiency of the pixel is the maximum.

2. The display device of claim 1,
wherein the plurality of pixels comprises first color pixels, second color pixels, and third color pixels, and
wherein the first electrode, the first opening, and the second opening are located at each of the plurality of pixels.

3. The display device of claim 2, wherein the first opening is smaller in size than the second opening in the plan view, and wherein the first opening is in the second opening in the plan view.

4. The display device of claim 2, wherein corners of the first opening and the second opening are chamfered with a curved line.

5. The display device of claim 2, wherein a planar shape of the first opening is a quadrangle including a first side, a second side adjacent to the first side in a clockwise direction, a third side adjacent to the second side in the clockwise direction, and a fourth side adjacent to the third side in the clockwise direction.

6. The display device of claim 5, wherein the planar shape of the first opening at at least one and fewer than all of the plurality of pixels is a square,
wherein a first separation distance between the first side of the first opening and the second opening is different than a second separation distance between the second side of the first opening and the second opening, wherein the first separation distance is the same as a third separation distance between the third side of the first opening and the second opening, and wherein the second separation distance is the same as a fourth separation distance between the fourth side of the first opening and the second opening.

7. The display device of claim 6, wherein the planar shape of the first opening at another pixel among the plurality of pixel is a rectangle, wherein the first separation distance is the same as the second separation distance, wherein the first separation distance is different than the third separation distance, and wherein the third separation distance is the same as the fourth separation distance.

8. The display device of claim 7, wherein the planar shape of the first openings at a first color pixel and a third color pixel is a square, a planar shape of the first opening at a second color pixel is a rectangle, and wherein the first color pixel is a red pixel, the second color pixel is a green pixel, and the third color pixel is a blue pixel.

9. The display device of claim 7, wherein the first separation distance at a first color pixel is the same as at least one of the first separation distance, the second separation distance, the third separation distance, and the fourth separation distance at a second color pixel, and the first separation distance at the first color pixel is the same as at least one of the first separation distance, the second separation distance, the third separation distance, and the fourth separation distance at the third color pixel.

10. The display device of claim 7, wherein at least one and fewer than all of the first separation distance, the second separation distance, the third separation distance, and the fourth separation distance is about 1.4 µm or more and less than about 2.3 µm, and another among the first separation distance, the second separation distance, the third separation distance, and the fourth separation distance is about 0.3 µm or more and less than about 1.2 µm.

11. The display device of claim 7, wherein, in a pixel at which a planar shape of the first opening is a square, a difference between the first separation distance and the second separation distance is about 0.2 µm or more and less than about 2.0 µm, and in a pixel at which a planar shape of the first opening is a rectangle, a difference between the first separation distance and the third separation distance is about 0.2 µm or more and less than about 2.0 µm.

12. The display device of claim 7, wherein, in pixels of the plurality of pixels at which planar shapes of the first openings are squares, the first separation distance is larger than the second separation distance, and in other pixels of the plurality of pixels, the first separation distance is smaller than the second separation distance.

13. The display device of claim 12, wherein a number of pixels of the plurality of pixels at which the first separation distance is larger than the second separation distance is the same as a number of pixels of the plurality of pixels at which the first separation distance is smaller than the second separation distance.

14. The display device of claim 7, wherein, in pixels of the plurality of pixels at which the planar shapes of the first openings are rectangles, the first separation distance is larger than the third separation distance, and in other pixels of the plurality of pixels, the first separation distance is smaller than the third separation distance.

15. The display device of claim 14, wherein a number of pixels of the plurality of pixels at which the first separation distance is larger than the third separation distance is the same as a number of pixels of the plurality of pixels at which the first separation distance is smaller than the third separation distance.

16. The display device of claim 7, wherein the first separation distance at a first color pixel is different than the first separation distance, the second separation distance, the third separation distance, and the fourth separation distance at a second color pixel.

17. The display device of claim 16, wherein the first separation distance at the first color pixel is different than the first separation distance, the second separation distance, the third separation distance, and the fourth separation distance at a third color pixel.

18. The display device of claim 2, wherein a planar shape of the first opening is an octagon including a first side, a second side adjacent to the first side in a clockwise direction, a third side adjacent to the second side in the clockwise direction, a fourth side adjacent to the third side in the clockwise direction, a fifth side adjacent to the fourth side in the clockwise direction, a sixth side adjacent to the fifth side in the clockwise direction, a seventh side adjacent to the sixth side in the clockwise direction, and an eighth side adjacent to the seventh side in the clockwise direction.

19. A display device comprising:

a substrate;

a plurality of pixels on the substrate;

a first electrode on the substrate;

a partitioning wall on the first electrode, the partitioning wall comprising a first opening that overlaps the first electrode;

a touch detection electrode on the partitioning wall;

a low refractive layer on the partitioning wall and the touch detection electrode, the low refractive layer comprising a second opening that overlaps the first opening; and a high refractive layer on the low refractive layer, wherein planar shapes of the first opening and the second opening are polygons comprising a plurality of sides, wherein a shortest distance between one side of the plurality of sides of the first opening and the second opening is different than a distance from another side of the plurality of sides of the first opening and the second opening in a plan view, wherein the plurality of pixels comprises first color pixels, second color pixels, and third color pixels, wherein the first electrode, the first opening, and the second opening are located at each of the plurality of pixels, wherein a planar shape of the first opening is an octagon including a first side, a second side adjacent to the first side in a clockwise direction, a third side adjacent to the second side in the clockwise direction, a fourth side adjacent to the third side in the clockwise direction, a fifth side adjacent to the fourth side in the clockwise direction, a sixth side adjacent to the fifth side in the clockwise direction, a seventh side adjacent to the sixth side in the clockwise direction, and an eighth side adjacent to the seventh side in the clockwise direction, and wherein a first separation distance between the first side of the first opening and the second opening is the same as a second separation distance between the second side of the first opening and the second opening, the first separation distance is the same as a third separation distance between the third side of the first opening and the second opening, the first separation distance is the same as a fourth separation distance between the fourth side of the first opening and the second opening, a fifth separation distance between the fifth side of the first opening and the second opening is the same as a sixth separation distance between the sixth side of the first opening and the second opening, the fifth separation distance is the same as a seventh separation distance between the seventh side of the first opening and the second opening, the fifth separation distance is the same as an eighth separation distance between the eighth side of the first opening and the second opening, and the first separation distance is different than the fifth separation distance.

20. The display device of claim 19, wherein corners of the first opening and the second opening are chamfered with a curved line.

* * * * *